United States Patent
Shin et al.

(10) Patent No.: US 9,897,298 B2
(45) Date of Patent: Feb. 20, 2018

(54) LIGHT EMITTING MODULE AND LIGHT UNIT HAVING THE SAME

(71) Applicant: LG INNOTEK CO., LTD., Seoul (KR)

(72) Inventors: Mi Na Shin, Seoul (KR); Eon Ho Son, Seoul (KR); Young Joo Ahn, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 190 days.

(21) Appl. No.: 15/015,916

(22) Filed: Feb. 4, 2016

(65) Prior Publication Data
US 2016/0230943 A1    Aug. 11, 2016

(30) Foreign Application Priority Data
Feb. 5, 2015  (KR) .................. 10-2015-0018108

(51) Int. Cl.
| | |
|---|---|
| *F21V 9/00* | (2015.01) |
| *F21V 23/00* | (2015.01) |
| *F21K 9/00* | (2016.01) |
| *H01L 25/00* | (2006.01) |
| *F21K 99/00* | (2016.01) |

(Continued)

(52) U.S. Cl.
CPC .............. *F21V 23/001* (2013.01); *F21K 9/00* (2013.01); *F21K 9/30* (2013.01); *H01L 25/00* (2013.01); *F21Y 2101/02* (2013.01); *F21Y 2105/001* (2013.01); *F21Y 2105/10* (2016.08); *F21Y 2105/12* (2016.08); *F21Y 2113/005* (2013.01); *F21Y 2113/13* (2016.08); *F21Y 2115/10* (2016.08); *H01L 2224/48091* (2013.01);
(Continued)

(58) Field of Classification Search
CPC .............. F21K 9/00; F21K 9/30; H01L 25/00
USPC ......................................... 362/231
See application file for complete search history.

(56) References Cited

U.S. PATENT DOCUMENTS

| | | |
|---|---|---|
| 6,200,002 B1 | 3/2001 | Marshall et al. |
| 7,744,242 B2 * | 6/2010 | Kramer ..................... F21K 9/00 313/502 |

(Continued)

FOREIGN PATENT DOCUMENTS

| | | |
|---|---|---|
| KR | 10-0591687 B1 | 6/2006 |
| KR | 10-2009-0062422 A | 6/2009 |

(Continued)

*Primary Examiner* — Bryon T Gyllstrom
(74) *Attorney, Agent, or Firm* — Birch, Stewart, Kolasch & Birch, LLP

(57) ABSTRACT

Disclosed is a light emitting module including a circuit board and a light source unit disposed on the circuit board. The light source unit includes a plurality of first, second and third light emitting devices emitting light of different colors, the plurality of first light emitting devices are disposed in an outer circumference of the second and third light emitting devices, the plurality of second light emitting devices are disposed in both sides of the plurality of the third light emitting devices, the plurality of first light emitting devices emits light having a wavelength longer than that of light emitted from the second and third light emitting devices. The plurality of second light emitting devices emits light having a wavelength longer than that of light emitted from the third light emitting devices, and the numbers of the first to third light emitting devices are different from one another.

20 Claims, 16 Drawing Sheets

(51) Int. Cl.
*F21Y 105/12* (2016.01)
*F21Y 105/10* (2016.01)
*F21Y 115/10* (2016.01)
*F21Y 113/13* (2016.01)
*F21Y 101/02* (2006.01)
*F21Y 105/00* (2016.01)
*F21Y 113/00* (2016.01)

(52) U.S. Cl.
CPC ............... *H01L 2224/48247* (2013.01); *H01L 2224/73265* (2013.01)

(56) References Cited

U.S. PATENT DOCUMENTS

| 8,928,023 | B1 | 1/2015 | Coleiny et al. | |
|---|---|---|---|---|
| 9,526,143 | B1* | 12/2016 | Petluri | H05B 33/0863 |
| 9,599,294 | B2* | 3/2017 | Rosenauer | F21S 10/02 |
| 2004/0218387 | A1* | 11/2004 | Gerlach | F21K 9/00 |
| | | | | 362/231 |
| 2009/0086475 | A1* | 4/2009 | Caruso | F21V 9/10 |
| | | | | 362/231 |
| 2009/0168414 | A1* | 7/2009 | Bailey | F21V 5/002 |
| | | | | 362/231 |
| 2010/0103678 | A1* | 4/2010 | Van De Ven | F21K 9/00 |
| | | | | 362/294 |
| 2012/0080713 | A1* | 4/2012 | Agatani | H01L 25/0753 |
| | | | | 257/99 |
| 2012/0236553 | A1* | 9/2012 | Cash | F21V 9/10 |
| | | | | 362/231 |
| 2012/0307488 | A1* | 12/2012 | Preuschl | H05K 1/029 |
| | | | | 362/231 |
| 2013/0038202 | A1 | 2/2013 | Donners | |
| 2013/0170174 | A1* | 7/2013 | Chou | H01L 25/0753 |
| | | | | 362/84 |
| 2014/0301071 | A1* | 10/2014 | Jorgensen | F21V 14/06 |
| | | | | 362/231 |
| 2016/0116141 | A1* | 4/2016 | Tseng | F21V 17/10 |
| | | | | 362/231 |

FOREIGN PATENT DOCUMENTS

| KR | 10-2011-0004017 A | 1/2011 |
|---|---|---|
| WO | WO 00/58664 A1 | 10/2000 |
| WO | WO 2011/138707 A1 | 11/2011 |

* cited by examiner

LIGHT EMITTING MODULE AND LIGHT UNIT HAVING THE SAME

CROSS-REFERENCE TO RELATED APPLICATION

The present application claims priority under 35 U.S.C. § 119(a) of Korean Patent Application No. 10-2015-0018108, filed on Feb. 5, 2015, which is hereby incorporated by reference in its entirety.

BACKGROUND

1. Field

Embodiments relate to a light emitting module and a light unit having the same.

2. Background

A light emitting device such as a light emitting diode, a kind of a semiconductor device converting electrical energy into light, replaces existing fluorescent and incandescent lamps and has received considerable attention as the next light source.

A light emitting device may generate light using a semiconductor device and thus, may consume relatively low power as compared to incandescent lamps generating light by heating tungsten or fluorescent lamps generating light by allowing ultraviolet light generated through high-pressure discharge to collide with phosphors.

In addition, since a light emitting device generates light using a potential gap of a semiconductor device, it may characteristics such as a relatively long lifespan, fast response characteristics, and eco-friendliness.

Accordingly, considerable research into replacing existing light sources into light emitting devices has been conducted, and the uses of the light emitting devices as light sources of lighting devices such as various lamps, liquid crystal displays, electronic boards, and streetlamps, which are utilized in indoor and outdoor environments, are being increased.

SUMMARY

An embodiment provides a light emitting module having a plurality of light emitting devices emitting light of different colors.

An embodiment provides a light emitting module in which groups of light emitting devices are positioned in consideration of heat-generation characteristics of the respective light emitting devices.

An embodiment provides a light emitting module in which groups of light emitting devices emitting light of different colors are positioned in consideration of heat-generation characteristics of the respective light emitting devices.

An embodiment provides a light emitting module in which a plurality of first to third light emitting devices emitting light of different colors are disposed in a region of a reflective member on a circuit board.

An embodiment provides a light emitting module allowing for high color rendition and color control and a light unit having the same.

A light emitting module according to an embodiment comprises: a circuit board; and a light source unit disposed on the circuit board, wherein the light source unit includes a plurality of first to third light emitting devices emitting light of different colors, the plurality of first light emitting devices are disposed in an outer circumference of the second and third light emitting devices, the plurality of second light emitting devices are disposed in both sides of the plurality of the third light emitting devices, the plurality of first light emitting devices are connected to each other in series and emits light having a wavelength longer than that of light emitted from the second and third light emitting devices, the plurality of second light emitting devices are connected to each other in series and emits light having a wavelength longer than that of light emitted from the third light emitting devices, the plurality of third light emitting devices are connected to each other in series, and the numbers of the first to third light emitting devices are different from one another.

A light emitting module according to another embodiment comprises: a circuit board; and a light source unit disposed on the circuit board, wherein the light source unit includes a plurality of first to third light emitting devices emitting light of different colors, the plurality of first light emitting devices are disposed in an outer circumference of the second and third light emitting devices, the plurality of second light emitting devices are disposed in both sides of the plurality of the third light emitting devices, the circuit board includes a first wiring part connecting the plurality of first light emitting devices to each other in series, a second wiring part connecting the plurality of second light emitting devices to each other in series, and a third wiring part connecting the plurality of the third light emitting devices to each other in series, the first wiring part is disposed outwardly of the second and third wiring parts on the circuit board, the first wiring part includes a plurality of wirings, and each of the plurality of wirings has an upper area wider than an upper area of each of wirings of the second and third wiring parts, and the number of each of the first to third light emitting devices increases in accordance with an increase in wavelength of emitted light.

DETAILED DESCRIPTION OF THE EMBODIMENTS

Figure 1:
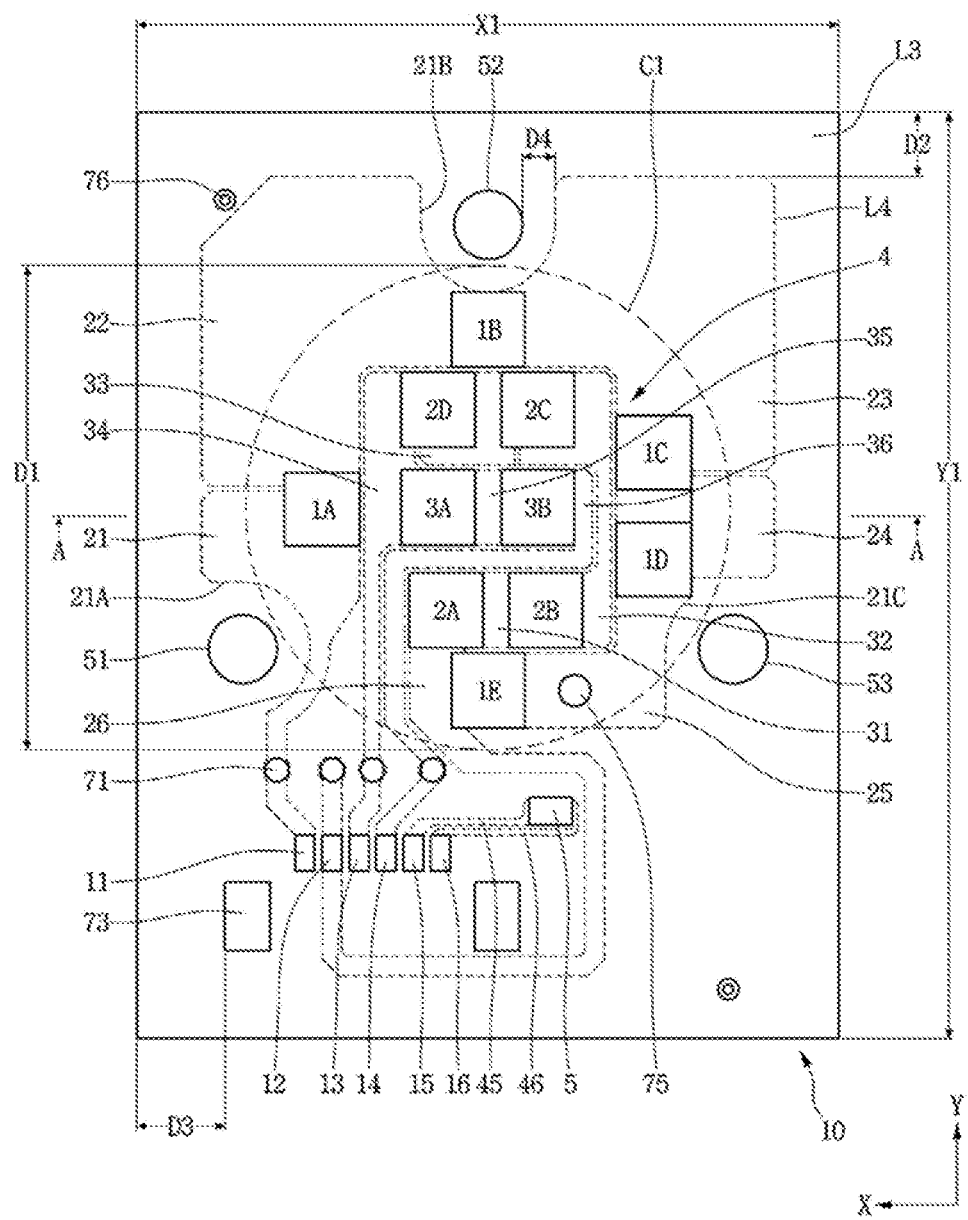
FIG. 1 is a plan view of a light emitting module according to a first embodiment.

Embodiments of the present invention will be described in detail such that they can be easily implemented by a person in the art to which the present invention pertains. However, the present invention may be embodied into various forms and is not limited to the embodiments described herein.

Through the entire specification, like elements are designated by the same reference numerals. If a portion such as a layer, a film, a region or a plate is mentioned as being positioned on another portion, such an expression may incorporate a case in which there exists still another portion therebetween as well as a case in which the portion is positioned directly on said another portion. On the contrary, if a portion is mentioned as being positioned directly on another portion, it means that there is no still another portion therebetween.

Hereinafter, a light emitting module according to a first embodiment of the present invention will be described with reference to FIG. 1 to FIG. 7.

Figure 2:
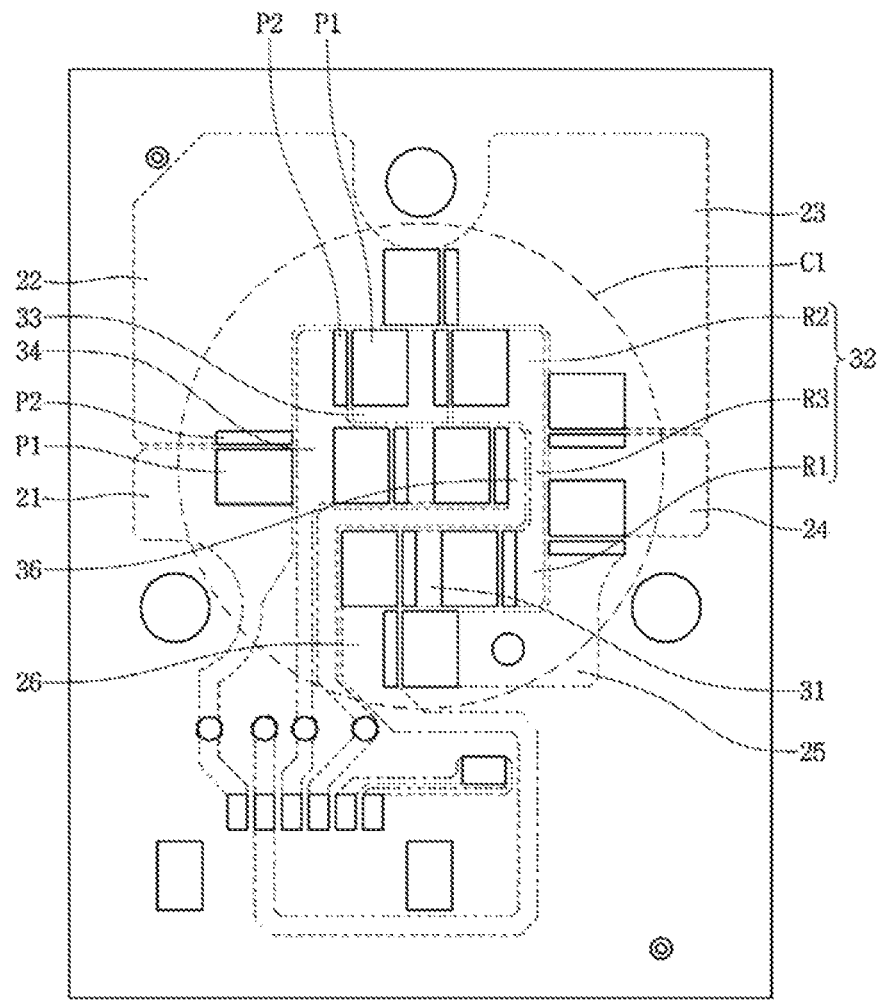
FIG. 2 is a plan view of a circuit board of the light emitting module of FIG. 1.
Figure 3:
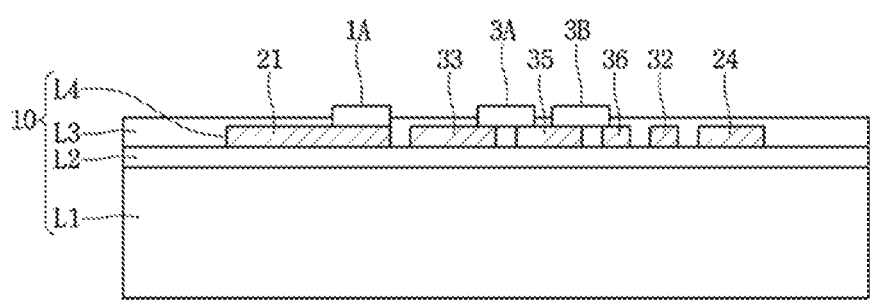
FIG. 3 is a cross-sectional view of the light emitting module of FIG. 1, taken along line A-A.
Figure 4:
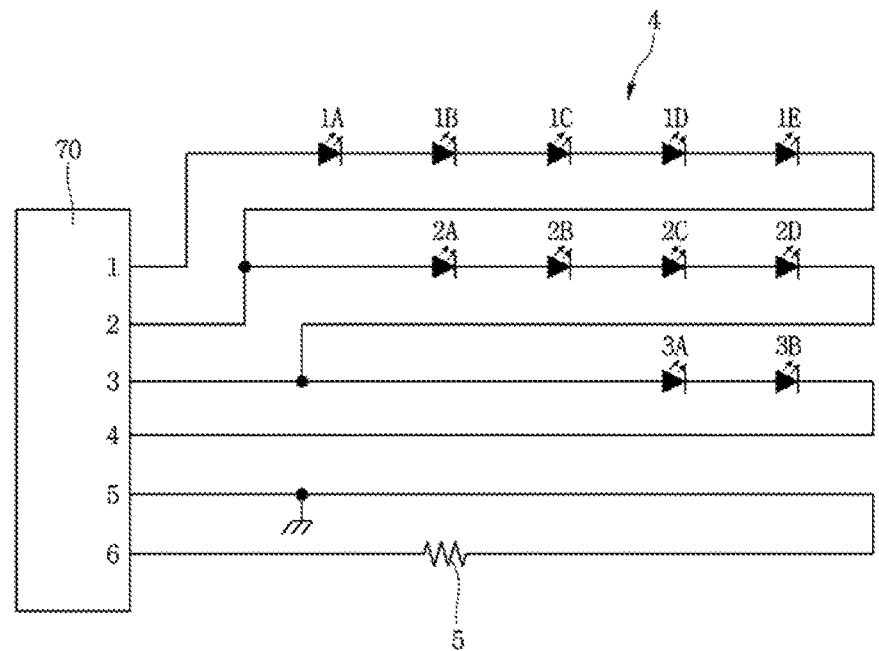
FIG. 4 is a circuit configuration view of the light emitting module of FIG. 1.
Figure 5:
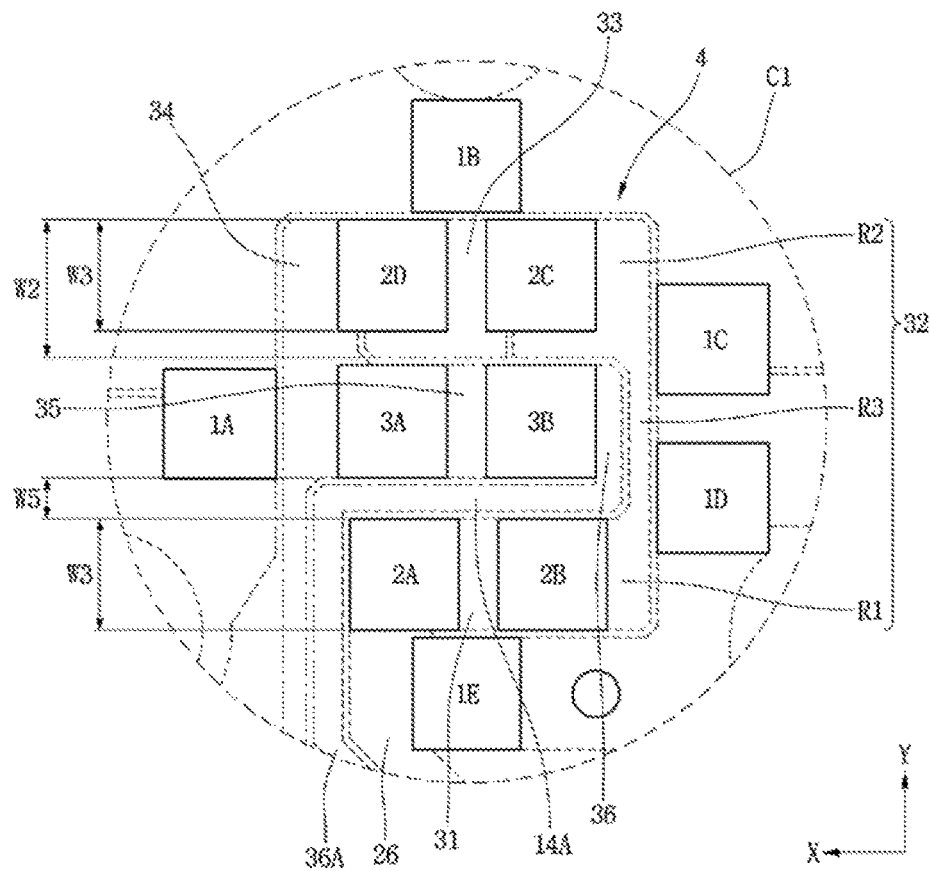
FIG. 5 is a view illustrating an example of arranging light emitting devices in the light emitting module of FIG. 1.
Figure 6:
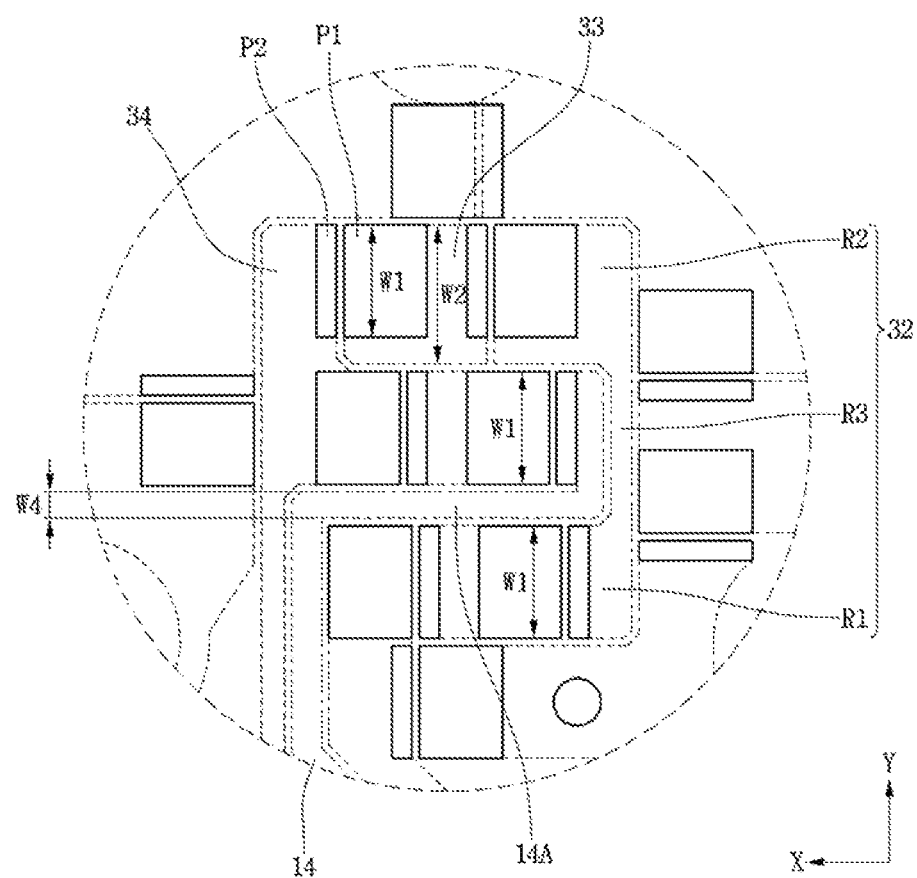
FIG. 6 is a view illustrating comparison widths of the light emitting device and a wiring in the light emitting module of FIG. 1.
Figure 7:
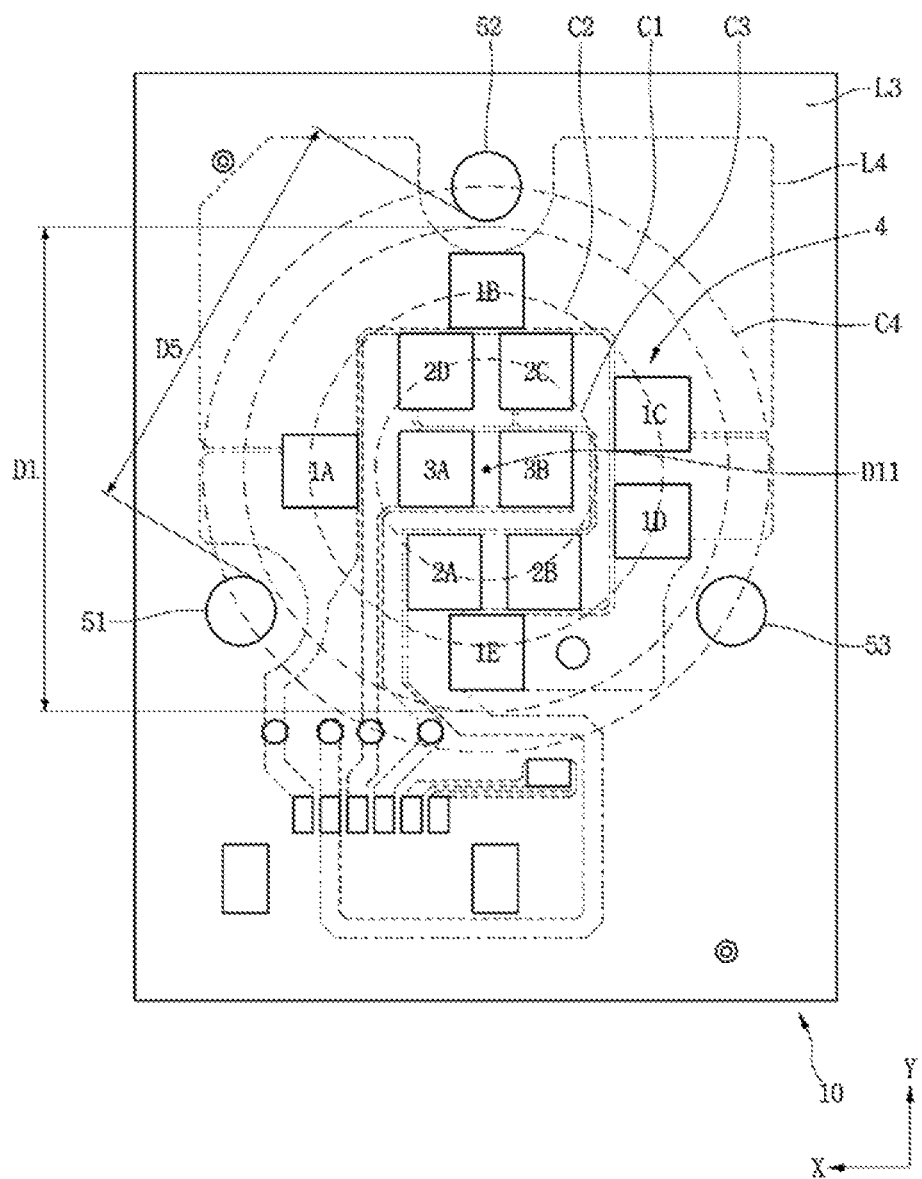
FIG. 7 is a view for explaining a form of arranging the light emitting devices in the light emitting module of FIG. 1.

FIG. 1 is a plan view of a light emitting module according to a first embodiment. FIG. 2 is a plan view of a circuit board of the light emitting module of FIG. 1. FIG. 3 is a cross-sectional view of the light emitting module of FIG. 1, taken along line A-A. FIG. 4 is a circuit configuration view of the light emitting module of FIG. 1. FIG. 5 is a view illustrating an example of arranging light emitting devices in the light emitting module of FIG. 1. FIG. 6 is a view illustrating comparison widths of the light emitting device and a wiring in the light emitting module of FIG. 1. FIG. 7 is a view for explaining a form of arranging the light emitting devices in the light emitting module of FIG. 1.

Referring to FIGS. 1 to 7, the light emitting module may include a circuit board 10 and a light source unit 4 disposed on the circuit board 10 and emitting light.

Referring to FIG. 1, the light source unit 4 may include a plurality of first light emitting devices 1A, 1B, 1C, 1D, and 1E emitting light of a first color, a plurality of second light emitting devices 2A, 2B, 2C, and 2D emitting light of a second color, and a plurality of third light emitting devices 3A and 3B emitting light of a third color.

Different numbers of the first light emitting devices 1A, 1B, 1C, 1D, and 1E, the second light emitting devices 2A, 2B, 2C, and 2D, and the third light emitting devices 3A and 3B may be arranged. As compared to the second light emitting devices 2A, 2B, 2C, and 2D or the third light emitting devices 3A and 3B, a more number of the first light emitting devices 1A,1B,1C,1D, and 1E may be disposed in the outside of the second and third light emitting devices 2A, 2B, 2C, 2D, 3A, and 3B.

The first light emitting devices 1A, 1B, 1C, 1D, and 1E may have heat-generation characteristics higher than those of the second light emitting devices 2A, 2B, 2C, and 2D and the third light emitting devices 3A and 3B. The second light emitting devices 2A, 2B, 2C, and 2D may have heat-generation characteristics equal to or higher than those of the third light emitting devices 3A and 3B. In the light emitting module according to the embodiment, devices having high heat-generation characteristics may be outwardly disposed, whereby loss due to heat generation may be reduced.

The first light emitting devices 1A, 1B, 1C, 1D, and 1E may emit light having a wavelength longer than a peak wavelength of light emitted from the second and third light emitting devices 2A, 2B, 2C, 2D, 3A, and 3B. The second light emitting devices 2A, 2B, 2C, and 2D may emit light having a wavelength longer than a peak wavelength of light emitted from the third light emitting devices 3A and 3B. In the light source unit 4, a more number of light emitting devices emitting light of a long wavelength may be disposed while a less number of light emitting devices emitting light of a short wavelength may be disposed.

The first light emitting devices 1A, 1B, 1C, 1D, and 1E may be red light emitting devices emitting red light in a visible light spectrum, and may emit light having a peak wavelength between 614 nm and 620 nm. The second light emitting devices 2A, 2B, 2C, and 2D may be green light emitting devices emitting green light in a visible light spectrum, and may emit light having a peak wavelength between 540 nm and 550 nm. The third light emitting devices 3A and 3B may be blue light emitting devices emitting blue light in a visible light spectrum, and may emit light having a peak wavelength between 455 nm and 470 nm.

The first light emitting devices 1A, 1B, 1C, 1D, and 1E may emit red light, the second light emitting devices 2A, 2B, 2C, and 2D may emit green light, and the third light emitting devices 3A and 3B may emit blue light. Accordingly, the light source unit 4 may emit white light formed by mixing red light, green light and blue light.

FIG. 4 is a circuit configuration view of the light emitting module. Referring to FIG. 4, the plurality of first light emitting devices 1A, 1B, 1C, 1D, and 1E may be connected to one another in series, the plurality of second light emitting devices 2A, 2B, 2C, and 2D may be connected to one another in series, and the plurality of third light emitting devices 3A and 3B may be connected to each other in series. An input terminal of the plurality of second light emitting devices 2A, 2B, 2C, and 2D connected to one another in series may be connected to an output terminal of the plurality of first light emitting devices 1A, 1B, 1C, 1D, and 1E. An input terminal of the plurality of third light emitting devices 3A and 3B connected to each other in series may be connected to an output terminal of the plurality of second light emitting devices 2A, 2B, 2C, and 2D.

Each of the light emitting devices 1A, 1B, 1C, 1D, 1E, 2A, 2B, 2C, 2D, 3A, and 3B of the light source unit 4 may be a light emitting diode (LED) package or chip.

The circuit board 10 may be formed as one of a resin-based printed circuit board (PCB), a metal core PCB (MCPCB), and a flexible PCB (FPCB). In the circuit board 10, a distance X1 in a first axial direction X may be longer than a distance Y1 in a second axial direction Y. The distance X1 in the first axial direction X may be defined as a width of the circuit board 10.

As in FIG. 1 and FIG. 3, the circuit board 10 may include a plurality of layers L1, L2, L3, and L4. The circuit board 10 may include a metal layer L1 for heat radiation, an insulating layer L2 for insulation from the metal layer L1, and a protective layer L3 and a wiring layer L4 on the insulating layer L2. The wiring layer L4 may be selectively connected to the light source unit 4.

The metal layer L1 of the circuit board 10 may have a thickness corresponding to 60% or more of a thickness of the circuit board 10, and may be formed of a material having high heat conductivity, for example, copper, aluminum, silver or gold, or an alloy containing one or more of these metal elements. The thickness of the metal layer L1 may be about 300 µm or more, for example, 500 µm or more.

The insulating layer L2 may insulate the metal layer L1 and the wiring layer L4 from each other and may contain an epoxy-based or polyimide-based resin. In the interior of the insulating layer L2, solid components such as fillers, glass fibers or the like may be dispersed, and unlike this, organic materials such as oxides, nitrides or the like may be dispersed. The insulating layer L2 may contain materials such as $SiO_2$, $TiO_2$, $SiO_x$, $SiO_xN_y$, $Si_3N_4$, and $Al_2O_3$. A thickness of the insulating layer L2 may be in a range of 5 µm to 7 µm.

As in FIG. 2 and FIG. 3, the wiring layer L4 of the circuit board 10 may be etched into a predetermined circuit pattern, and the protective layer L3 may be exposed to some regions of an upper surface of the circuit pattern, whereby the regions may serve as pads P1 and P2. The wiring layer L4 may be formed of copper or an alloy containing copper. A surface of the wiring layer L4 may be treated with nickel, silver, gold or palladium or an alloy containing one or more of these elements. A thickness of the wiring layer L4 may be 100 µm or more. The wiring layer L4 may be connected to the light emitting devices 1A, 1B, 1C, 1D, 1E, 2A, 2B, 2C, 2D, 3A, and 3B through the plurality of pads P1 and P2.

The protective layer L3 may be formed of a material protecting the wiring layer L4. The protective layer L3, a layer blocking regions other than the pads from being exposed, may contain an insulating material such as solder resist. The protective layer L3 may exhibit white color and may improve light reflection efficiency. The pads P1 and P2 of the protective layer L3 may be opened. The opened region may be selectively formed in a shape from among a circular shape, a hemispherical shape, a polygonal shape, and an atypical shape, but is not limited thereto.

As in FIG. 1 and FIG. 2, the wiring layer L4 of the circuit board 10 may include a first wiring part 21,22,23,24,25, and 26 connecting the plurality of first light emitting devices 1A, 1B, 1C, 1D, and 1E, a second wiring part 31,32,33 and 34 connecting the plurality of second light emitting devices 2A, 2B, 2C, and 2D, and a third wiring part 35 and 36 connecting the plurality of third light emitting devices 3A and 3B.

The first wiring part 21, 22, 23, 24, 25, and 26 may be disposed in the outside of the second wiring part 31,32,33 and 34 and the third wiring part 35 and 36. The first wiring part 21,22,23,24,25, and 26 may be disposed in the outside of the second and third light emitting devices 2A,2B,2C, 2D,3A, and 3B. Wirings of the first wiring part 21, 22, 23, 24, 25, and 26 may be spaced apart from one another and may connect the plurality of first light emitting devices 1A, 1B, 1C, 1D, and 1E to one another.

The first wiring part 21, 22, 23, 24, 25, and 26 may connect the first light emitting devices 1A, 1B, 1C, 1D, and 1E to one another in series. The plurality of second light emitting devices 2A, 2B, 2C, and 2D may be disposed in the inside of the first wiring part 21,22,23,24,25, and 26 and may be connected to one another in series by the second wiring part 31,32,33 and 34. The plurality of third light emitting devices 3A and 3B may be disposed among the plurality of first light emitting devices 1A, 1B, 1C, 1D, and 1E and may be connected to each other in series by the third wiring part 35 and 36.

The first wiring part 21, 22, 23, 24, 25, and 26 may include a plurality of wirings, for example, first to sixth wirings 21, 22, 23, 24, 25, and 26. The wiring number of the first wiring part 21, 22, 23, 24, 25, and 26 may be, for example, greater than the number of the first light emitting devices 1A, 1B, 1C, 1D, and 1E by one.

Each of the wirings of the first wiring part 21, 22, 23, 24, 25, and 26 may have an upper area greater than an upper area of each of the wirings of the second and third wiring parts 31, 32, 33, 34, 35, and 36.

Both terminal wirings of the first wiring part 21, 22, 23, 24, 25, and 26 may be connected to first and second connection terminals 11 and 12 through line wirings. For example, the first and sixth wirings 21 and 26 may be connected to a connector (70 of FIG. 4) through the first and second connection terminals 11 and 12. Each of the first and sixth wirings 21 and 26 may have a surface area smaller than that of each of the second to fourth wirings 22, 23, 24 and 25. The surface areas of the second to fourth wirings 22, 23, 24 and 25 may be greater than those of the first and sixth wirings 21 and 26 to thereby prevent the concentration of heat generated from the light source unit 4.

Since upper areas of the second to fourth wirings 22, 23, 24 and 25 of the first wiring part 21, 22, 23, 24, 25, and 26 may be disposed wider than those of the first and sixth wirings 21 and 26, heat radiation efficiency of the first light emitting devices 1A, 1B, 1C, 1D, and 1E may be improved, and operating reliability of the first light emitting devices 1A, 1B, 1C, 1D, and 1E may be improved.

The surface areas or upper areas of the second and third wirings 22 and 23 disposed in the opposite side of connection terminals 11,12,13,14,15, and 16 on the circuit board 10 may be wider than the surface areas or upper areas of remaining wirings 21, 24, 25 and 26, whereby heat generated from the first, second and third devices 1A, 1B, and 1C disposed in a heat concentration region among the plurality of first light emitting devices 1A, 1B, 1C, 1D, and 1E may be effectively radiated.

The first to sixth wirings 21, 22, 23, 24, 25, and 26 may include the pads P1 and P2 disposed below the first light emitting devices 1A, 1B, 1C, 1D, and 1E. For example, the pads P1 and P2 of the first to sixth wirings 21, 22, 23, 24, 25, and 26 may be electrically connected to the respective first light emitting devices 1A, 1B, 1C, 1D, and 1E. The pads P1 and P2 may be regions from which the protective layer L3 has been removed.

The plurality of first light emitting devices 1A, 1B, 1C, 1D, and 1E may be disposed in opposite sides based on regions of the second light emitting devices 2A, 2B, 2C, and 2D and the third light emitting devices 3A and 3B. For example, the first device 1A and the third and fourth devices 1C and 1D may be disposed opposite each other, and the second device 1B and the fifth device 1E may be disposed opposite each other among the plurality of first light emitting devices 1A, 1B, 1C, 1D, and 1E. Alternatively, at least two of the plurality of first light emitting devices 1A, 1B, 1C, 1D, and 1E may be symmetrically positioned with respect to each other and for example, the second device 1B and the fifth device 1E may be symmetrically positioned with respect to each other.

The second wiring part 31, 32, 33 and 34 may include seventh to tenth wirings 31, 32, 33 and 34. The second wiring part 31, 32, 33 and 34 may include the seventh wiring 31 connected to an output terminal of the first wiring part 21, 22, 23, 24, 25, and 26, for example, the sixth wiring 26, the eighth wiring 32 adjacent to the seventh wiring 31, the ninth wiring 33 adjacent to the eighth wiring 32, and the tenth wiring 34 adjacent to the ninth wiring 33.

An output terminal of the first wiring part 21, 22, 23, 24, 25, and 26 may be an input terminal of the second wiring part 31, 32, 33 and 34. For example, the sixth wiring 26 of the first wiring part 21, 22, 23, 24, 25, and 26 may be an input wiring of the second wiring part 31,32,33 and 34. The second wiring part 31, 32, 33 and 34 may connect the first to fourth devices 2A, 2B, 2C, and 2D of the second light emitting devices 2A, 2B, 2C, and 2D to one another in series.

An output terminal of the second wiring part 31,32,33 and 34 may be connected to an input terminal of the third wiring part 35 and 36. For example, the tenth wiring 34 of the output terminal of the second wiring part 31,32,33 and 34 may be a wiring of the input terminal of the third wiring part 35 and 36. The third wiring part 35 and 36 may connect the first and second devices 3A and 3B of the third light emitting devices 3A and 3B to each other in series.

As in FIG. 4, the output terminal of the plurality of first light emitting devices 1A, 1B, 1C, 1D, and 1E may be connected to the input terminal of the plurality of second light emitting devices 2A, 2B, 2C, and 2D, and the output terminal of the plurality of second light emitting devices 2A, 2B, 2C, and 2D may be connected to the input terminal of the plurality of third light emitting devices 3A and 3B.

At least two devices 2A and 2B of the second light emitting devices 2A, 2B, 2C, and 2D may be disposed in a region between the fifth device 1E of the first light emitting devices 1A, 1B, 1C, 1D, and 1E and the third light emitting devices 3A and 3B, and the remaining at least two devices may be disposed in a region between the second device 1B of the first light emitting devices 1A, 1B, 1C, 1D, and 1E and the third light emitting devices 3A and 3B.

In the first light emitting devices 1A, 1B, 1C, 1D, and 1E, an interval between the second and fifth devices 1B and 1E may be greater than an interval between the first device 1A and the third device 1C or the fourth device 1D.

The plurality of third light emitting devices 3A and 3B may be disposed among the devices 1A, 1C, and 1D of the first light emitting devices 1A, 1B, 10, 1D, and 1E in the first direction X, and may be disposed among the devices 2A, 2B, 2C, and 2D of the second light emitting devices 2A, 2B, 2C, and 2D in the second direction Y. The first direction X may be a width direction of the circuit board 10, and the second direction Y may be a direction of the length Y1 longer than the width X1 of the circuit board 10.

The plurality of first light emitting devices 1A, 1B, 1C, 1D, and 1E may be disposed in opposite sides based on regions of the second light emitting devices 2A, 2B, 2C, and 2D and the third light emitting devices 3A and 3B. That is, at least one pair of first light emitting devices may oppose each other or correspond to each other in both outsides of the second and third light emitting devices.

The number of the plurality of second light emitting devices 2A, 2B, 2C, and 2D may be smaller than the number of the first light emitting devices 1A, 1B, 1C, 1D, and 1E, and may be greater than the number of the third light emitting devices 3A and 3B. The number of the second light emitting devices 2A, 2B, 2C, and 2D may be 150% or more, for example, 200% or more of the number of the third light emitting devices 3A and 3B. The third light emitting devices 3A and 3B may include at least two third light emitting devices.

The number of the first light emitting devices 1A, 1B, 1C, 1D, and 1E may be 125% or more of the number of the second light emitting devices 2A, 2B, 2C, and 2D. The respective devices of the first to third light emitting devices 1A,1B,1C,1D,1E, 2A,2B,2C,2D, 3A, and 3B may be arranged in different numbers according to luminous intensity, whereby luminance uniformity of light emitted from the circuit board 10 may be improved.

The overall surface area of the first wiring part 21,22,23, 24,25, and 26 connected to the first light emitting devices 1A, 1B, 1C, 1D, and 1E may be wider than the overall surface area of the second wiring part 31,32,33 and 34 connected to the second light emitting devices 2A, 2B, 2C, and 2D. The overall surface area of the second wiring part 31,32,33 and 34 connected to the second light emitting devices 2A, 2B, 2C, and 2D may be wider than the overall surface area of the third wiring part 35 and 36 connected to the third light emitting devices 3A and 3B. Accordingly, the first light emitting devices 1A, 1B, 1C, 1D, and 1E having the highest heat-generation characteristics may be disposed in the outermost portion of the light source unit 4, and heat emitted from the first light emitting devices 1A, 1B, 1C, 1D, and 1E may be effectively radiated. In addition, it may be possible to prevent heat emitted from the first light emitting devices 1A, 1B, 1C, 1D, and 1E from affecting other second and third light emitting devices 2A,2B,2C,2D,3A, and 3B.

As in FIG. 1 and FIG. 2, a plurality of openings 51, 52 and 53 may be disposed in the outside of arbitrary wirings of the first wiring part 21,22,23,24,25, and 26. The plurality of openings 51, 52 and 53 may include a first opening 51 disposed in an outside 21A of the first wiring 21, a second opening 52 disposed in an outside 21B of the second and third wirings 22 and 23, and a third opening 53 disposed in an outside 21C of the fourth and fifth wirings 24 and 25.

A linear shape connecting the first to third openings 51, 52, and 53 to each other may be a triangular shape. The plurality of openings 51, 52 and 53 may be disposed in the outside of the light source unit 4 and may support a lower portion of a reflective member to be described later.

The pads P1 and P2 of the first to sixth wirings 21,22, 23,24,25, and 26 may be disposed inwardly of positions of the first to third openings 51, 52, and 53. The light source unit 4 may be disposed in the inside of a first virtual circle C1 having a predetermined radius from an optional center of the circuit board 10. The center of the first virtual circle C1 may be the center of the light source unit 4. A diameter D1 of the first virtual circle C1 may be 19 mm or more, for example, 22 mm or more, and such a diameter D1 may be varied depending on sizes and the numbers of the first to third light emitting devices 1A,1B,1C,1D,1E, 2A,2B,2C,2D, 3A, and 3B of the light source unit 4. The first virtual circle C1 defining a region of the light source unit 4 may be in a range of 19 mm to 30 mm, for example, in a range of 20 mm to 25 mm. The first virtual circle C1 may define a boundary region of the reflective member capable of being disposed in a circumferential portion of the light source unit 4. The diameter D1 of the first virtual circle C1 may be set in consideration of the uniformity of luminous flux and luminance of light generated from the light source unit 4.

The first to third wiring parts 21,22,23,24,25,26,31,32,33, 34, 35, and 36 may be selectively connected to the connection terminals 11, 12, 13 and 14. Test pads 71 may be exposed to respective lines adjacent to the connection terminals 11, 12, 13 and 14. Whether or not the respective wirings operate, a current and a voltage, and the like may be tested through the test pads 71.

A recognition mark 76 may be disposed on the circuit board 10. The recognition mark 76 may be disposed outside the first virtual circle C1. The recognition mark 76 may be a mark for setting coordinates at the time of surface mounting technology (SMT). The recognition mark 76 may be disposed outwardly of the first wiring part 21,22,23,24,25, and 26.

A module temperature sensing region 75 may be disposed in an arbitrary wiring of the first wiring part 21,22,23,24,25, and 26, and the module temperature sensing region 75 may be a region in which a portion of the wiring is exposed. The module temperature sensing region 75 may be disposed adjacent to arbitrary devices 1D and 1E of the first light emitting devices 1A, 1B, 1C, 1D, and 1E. Accordingly, the module temperature sensing region 75 may be disposed adjacent to arbitrary devices 1D and 1E of the first light emitting devices 1A, 1B, 1C, 1D, and 1E, which are most sensitive to temperature, and may provide a module temperature.

Referring to FIG. 1, a heat sensing device 5 may be disposed on the circuit board 10. The heat sensing device 5 may be disposed in a region adjacent to any device of the first light emitting devices 1A, 1B, 1C, 1D, and 1E, for example, the sixth device 1E. The heat sensing device 5 may be disposed adjacent to any device 1E of the first light emitting devices 1A, 1B, 1C, 1D, and 1E having the highest heat-generation characteristics among the first to third light emitting devices 1A,1B,1C,1D,1E, 2A,2B,2C,2D, 3A, and 3B.

The heat sensing device 5 may be connected to the connection terminals 15 and 16 through a fourth wiring part 45 and 46. The heat sensing device 5 may be a thermistor, a variable resistor having a resistance value varied according to temperature. The heat sensing device 5 may be a negative temperature coefficient (NTC) in which specific resistance is lowered in accordance with an increase in temperature. Alternatively, the heat sensing device 5 may be a positive temperature coefficient (PTC).

The connector 70 may be disposed in the connection terminals 11,12,13,14,15, and 16 and an external connection terminal 73. The connector 70 may selectively supply power to the connection terminals 11,12,13, and 14 and drive the first to third light emitting devices 1A,1B,1C,1D,1E, 2A,2B, 2C,2D, 3A, and 3B to be turned on or off. Similarly to FIG. 4, the first to third light emitting devices 1A,1B,1C,1D,1E, 2A,2B,2C,2D, 3A, and 3B may be selectively driven or simultaneously turned on or off, but are not limited thereto.

In the circuit board 10, an interval D4 between the opening 51, 52 or 53 and the wring layer L4 may be 1.2 mm or more, for example, 1.5 mm or more. The interval D4 may prevent electrical interference with the wiring layer L3.

In the circuit board 10, the first wiring part 21,22,23,24, 25, and 26 may be spaced apart from an edge of the circuit board 10 by a predetermined distance D2. The distance D2 may be 2.5 mm or more, for example, 3 mm or more. When the distance D2 is extremely small, a leakage current may occur through the edge of the circuit board 10.

The external connection terminal 73 may be spaced apart from the edge of the circuit board 10 by a predetermined distance D3, and the distance D3 may be wider than the distance D2. The distance D3 may be 3.5 mm or more, for example, 4 mm or more. The distance D3 may be varied depending on a supply voltage.

Referring to FIG. 5 and FIG. 6, a width W3 of the seventh wiring 31 of the second wiring part 31, 32, 33 and 34 may be narrower than a width W2 of the ninth wiring 99. An interval W5 between the first and second devices 2A and 2B of the second light emitting devices 2A,2B,2C, and 2D, and the third light emitting devices 3A and 3B may be identical to an interval between the third and fourth devices 2C and 2D of the second light emitting devices 2A,2B,2C, and 2D, and the third light emitting devices 3A and 3B. Although the width W3 of the seventh wiring 31 and the width W2 of the ninth wiring 33 are different from each other, the same interval W5 between the second light emitting devices and the third light emitting devices 3A and 3B may be provided, whereby the seventh wiring 31 of the second wiring part 31, 32, 33 and 34 and a width W4 of a connection wiring 14A between the third wiring part 35 and 36 may be compensated for by the width W2 of the ninth wiring 33 of the second wiring part 31, 32, 33 and 34.

Widths W1 of pads P1 and P2 of the seventh and ninth wirings 31 and 33 may be identical to each other, but are not limited thereto. The widths W1 of the pads P1 and P2 of the seventh and ninth wirings 31 and 33 may be identical to widths (for example, W1) of the second light emitting devices 2A, 2B, 2C and 2D in the second direction, but are not limited thereto. The width W2 of the ninth wiring 33 may be wider than the widths W1 of the pads P1 and P2 of the ninth wiring 33.

The eighth wiring 32 of the second wiring part 31, 32, 33 and 34 may include a first region R1 adjacent to the seventh wiring 31, a second region R2 adjacent to the ninth wiring 33, and a third region R3 diverged in regions between the third and fourth devices 1C and 1D of the first light emitting devices 1A, 1B, 1C, 1D, and 1E and the second device 3B of the third light emitting devices 3A and 3B. A width of the first region R1 may be identical to the width W1 of the seventh wiring 31, and a width of the third region R3 may be identical to the width W2 of the ninth wiring 33 but may be wider than the width of the first region R1. A width of the second region R2 of the eighth wiring 32 may be wider than the widths (for example, W1) of the second light emitting devices 2A, 2B, 2C and 2D in the second direction.

In this manner, since the interval W5 between the first and second devices 2A and 2B of the second light emitting devices 2A,2B,2C, and 2D, and the third light emitting devices 3A and 3B may be identical to that between the third and fourth devices 2C and 2D of the second light emitting devices 2A,2B,2C, and 2D, luminance uniformity among the devices may be provided.

The third wiring part 35 and 36 may connect the third light emitting devices 3A and 3B to each other in series. Widths of the wirings of the third wiring part 35 and 36 may be identical to widths of the third light emitting devices 3A and 3B.

Referring to FIG. 7, an outer boundary line of the light source unit 4 on the circuit board 10 may be implemented by a first virtual circle C1. The first virtual circle C1 may have a diameter smaller than that of a virtual circle C4 passing the plurality of openings 51, 52 and 53, and may have a diameter greater than that of a second virtual circle C2 passing the plurality of first light emitting devices 1A, 1B, 1C, 1D, and 1E. The first virtual circle C1 may have a predetermined radius about a center D11, a region between the plurality of third light emitting devices 3A and 3B.

The plurality of first light emitting devices 1A, 1B, 1C, 1D, and 1E may be disposed inwardly of the first virtual circle C1. The first virtual circle C1 may be disposed outwardly of the plurality of first to third light emitting devices 1A,1B,1C,1D,1E, 2A,2B,2C,2D, 3A, and 3B. The plurality of first light emitting devices 1A, 1B, 1C, 1D, and 1E may be more adjacent to the first virtual circle C1 as compared to the plurality of second and third light emitting devices 2A,2B,2C,2D,3A, and 3B.

The second virtual circle C2, a circle passing the plurality of first light emitting devices 1A, 1B, 1C, 1D, and 1E, may be disposed outwardly of the plurality of second light emitting devices 2A, 2B, 2C, and 2D. A third virtual circle C3, a circle passing the plurality of second light emitting devices 2A, 2B, 2C, and 2D, may be disposed inwardly of the plurality of first light emitting devices 1A, 1B, 1C, 1D, and 1E and may be disposed outwardly of the third light emitting devices 3A and 3B. The center D11 of the first to third virtual circles C1,C2, and C3 may be the center of the light source unit 4, and may be the region between the plurality of third light emitting devices 3A and 3B. A diameter D1 of the first virtual circle C1 may be smaller than a distance D5 between the first to third openings, which may be varied depending on the number of the openings 51, 52 and 53. The second virtual circle C2 passing the plurality of first light emitting devices 1A, 1B, 1C, 1D, and 1E may be disposed inwardly of positions of the first to third openings 51, 52 and 53. Accordingly, the light source unit 4 may be disposed at an optimal position in consideration of thermal characteristics. The light source unit 4 may be disposed within a region of the first virtual circle C1.

Figure 8:
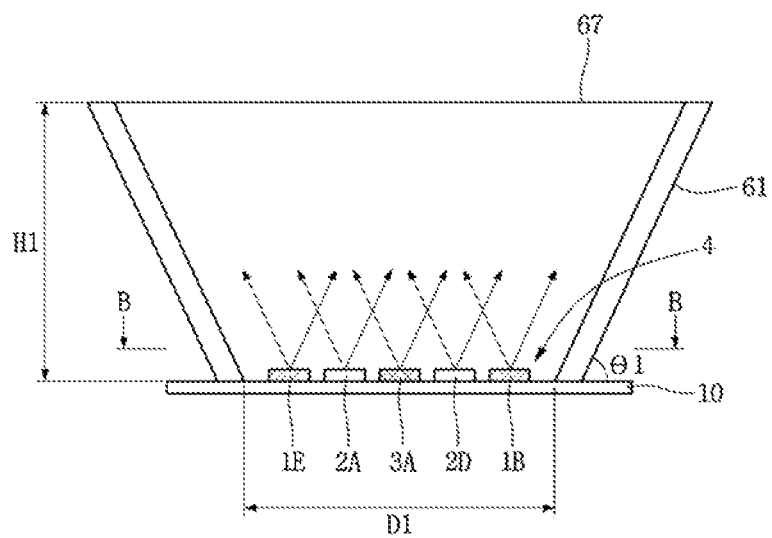
FIG. 8 is a side cross-sectional view of a light emitting module according to a second embodiment.
Figure 9:
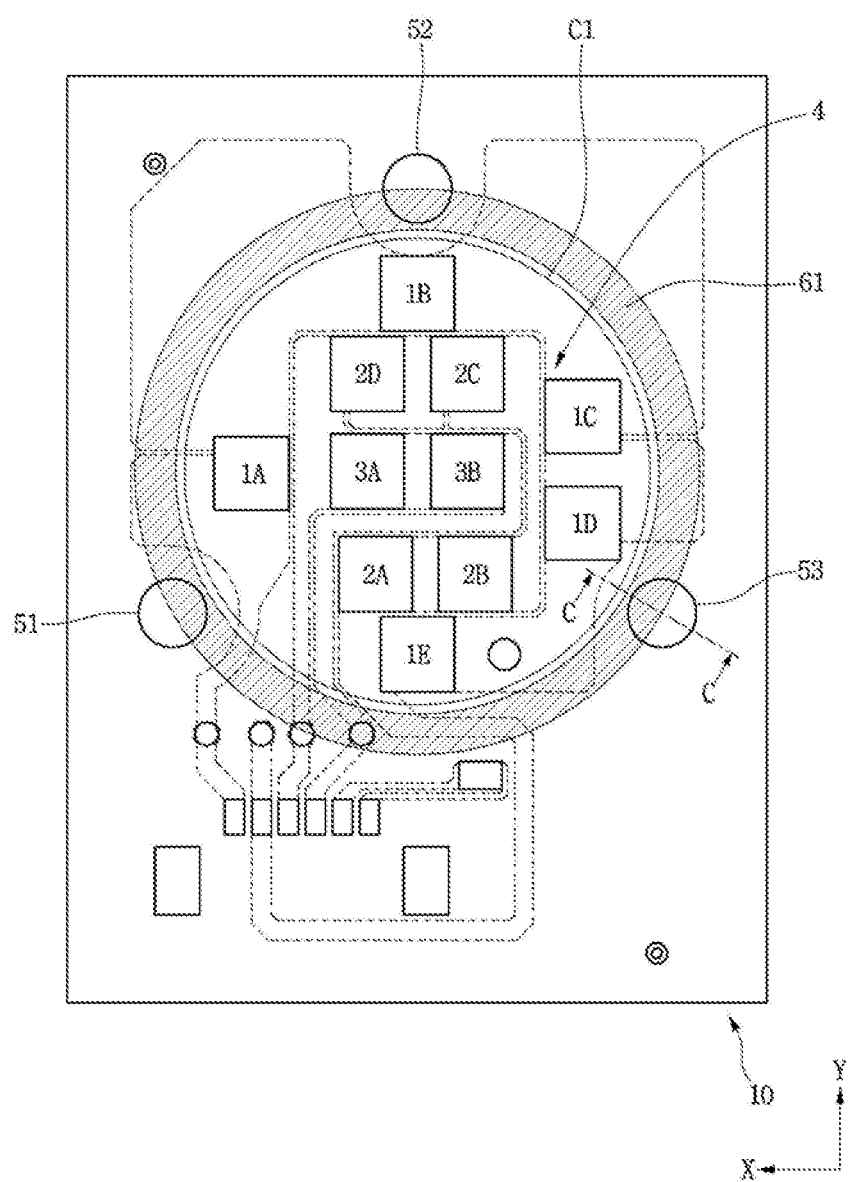
FIG. 9 is a cross-sectional view of the light emitting module of FIG. 8, taken along line B-B.
Figure 10:
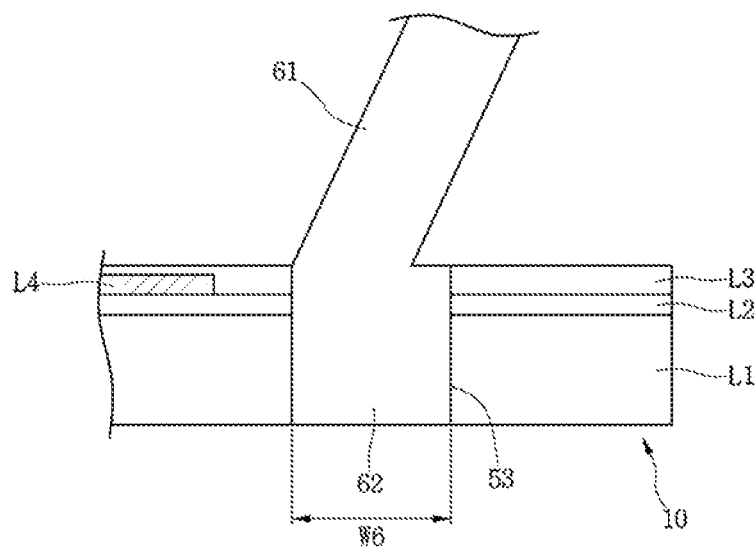
FIG. 10 is a cross-sectional view of the light emitting module of FIG. 9, taken along line C-C.

FIG. 8 is a side cross-sectional view of a light emitting module according to a second embodiment. FIG. 9 is a cross-sectional view of the light emitting module of FIG. 8, taken along line B-B. FIG. 10 is a cross-sectional view of the light emitting module of FIG. 9, taken along line C-C.

Referring to FIG. 1 and FIG. 8 to FIG. 10, the light emitting module may include the light source unit 4 having the plurality of first to third light emitting devices 1A,1B, 1C,1D,1E,2A,2B,2C,2D,3A, and 3B according to the embodiment on the circuit board 10, and a reflective member 61 disposed in the circumference of the light source unit 4.

The light emitting module may include the light source unit 4 having the plurality of first to third light emitting devices 1A,1B,1C,1D,1E,2A,2B,2C,2D,3A, and 3B according to the embodiment illustrated in FIG. 1 on the circuit board 10. This configuration will be provided with reference to the description of the first embodiment.

The reflective member 61 may be attached onto the circuit board 10. The reflective member 61 may enclose the light source unit 4 having the plurality of first to third light emitting devices 1A,1B,1C,1D,1E,2A,2B,2C,2D,3A, and 3B according to the embodiment illustrated in FIG. 1, and may reflect emitted light.

The reflective member 61 may have a reflective surface reflecting light from the first to third light emitting devices 1A,1B,1C,1D,1E,2A,2B,2C,2D,3A, and 3B. The reflective member 61 may be substantially perpendicular with respect to the circuit board 10 or may form an acute angle θ1 with an upper surface of the circuit board 10. The reflective surface may be formed by a coating method or a deposition method using a material capable of easily reflecting light.

The first light emitting devices 1A, 1B, 1C, 1D, and 1E may be more adjacent to the reflective member 61 as compared to the second and third light emitting devices 2A,2B,2C,2D,3A, and 3B.

The reflective member 61 may contain a resin material or a metal material. The resin material may include a plastic material or a resin material such as silicon or epoxy. The reflective member 61 may include the resin material such as silicon or epoxy, and a metal oxide may be added in the interior of the reflective member 61. The metal oxide may have a refractive index higher than that of the molding member and for example, may include $TlO_2$, $Al_2O_3$, or $SiO_2$. The metal oxide may be added to the reflective member in an amount of 5 w % or more, and may exhibit reflectivity of 50% or more, for example, 78% or more, with respect to incident light.

When the reflective member 61 is formed of a metal material, the reflective member 61 may be spaced apart from the first to third wiring parts of the circuit board 10, and may contain at least one of aluminum (Al), silver (Ag), an aluminum alloy, or a silver alloy.

A height H1 of the reflective member 61 may be a height allowing for the color mixture of light emitted from the light source unit 4, but is not limited thereto.

The height H1 of the reflective member 61 may be greater than the diameter D1 of the first virtual circle C1 illustrated in FIG. 1 and FIG. 9 or a diameter of the reflective member 61 in order to minimize differences in color senses. The height H1 of the reflective member 61 may be in a range from equal to or greater than 150% to equal to or less than 300% of the diameter D1 of the first virtual circle C1 illustrated in FIG. 1 and FIG. 9 or the diameter of the reflective member 61. The height H1 of the reflective member 61 may be in a range of 150% to 250% of the diameter D1 of the first virtual circle C1 illustrated in FIG. 1 and FIG. 9 or the diameter of the reflective member 61. When the height H1 of the reflective member 61 deviates from the range, light reflective efficiency or light extraction efficiency may be degraded, thereby leading to differences in color senses or a lowering in luminance.

Here, the heat sensing device 5 may be disposed outwardly of the reflective member 61.

The light emitting module may be disposed on the circuit board 10 and may include a light-transmissive member 67 disposed within the reflective member 61. The light-transmissive member 67 may contain a transparent resin material such as silicon or epoxy. A phosphor may not be added in the light-transmissive member 67. As another example, at least one of a dispersing agent, a scattering agent, or a phosphor may be added in the light-transmissive member 67, but the light-transmissive member 67 is not limited thereto.

The light-transmissive member 67 may contact the upper surface of the circuit board 10 and an inside surface of the reflective member 61. A thickness of the light-transmissive member 67 may be identical to or higher than the height of the reflective member 61, but is not limited thereto. An upper surface of the light-transmissive member 67 may include at least one of a convex surface, a concave surface or a flat surface.

An upper diameter of the light-transmissive member 67 may be wider than a lower diameter D3 thereof.

The reflective member 61 may be disposed in the outside or a boundary line of the first virtual circle C1 illustrated in FIG. 9. The reflective member 61 may have a circular shape, an oval shape, or a polygonal shape when viewed from the top thereof.

The reflective member 61 may be coupled to the openings 51, 52 and 53 of the circuit board 10 of FIG. 9. As in FIG. 9 and FIG. 10, a lower portion 62 of the reflective member 61 may be extended to the openings 51, 52 and 53 of the circuit board 10. The openings 51, 52 and 53 of the circuit board 10 may support the lower portion 62 of the reflective member 61 in different positions thereof. The reflective member 61 may be coupled to the plurality of openings 51, 52 and 53 disposed in the circuit board 10 and may be supported on the circuit board 10. As another example, when the reflective member 61 is formed of a metal material, it may be insulated from the metal layer L1 and the wiring layer L4 of the circuit board 10 through an insulating material.

The reflective member 61 may be coupled to the openings, and may contact the upper surface of the circuit board 10, for example, the protective layer L3. Accordingly, the reflective member 61 may contact the upper surface of the circuit board 10 and reflect light.

As in FIG. 10, the reflective member 61 may be disposed on an upper surface of the protective layer L3 of the circuit board 10. A width of a lower surface of the reflective member 61 may be identical to or less than a width W6 of the opening 62, but is not limited thereto.

As in FIG. 10, the lower portion 62 of the reflective member 61 may contact the protective layer L3, the insulating layer L2, and the metal layer L1 of the circuit board 10 within the openings 51, 52 and 53. The positions of the openings 51, 52 and 53 may be disposed in regions not vertically overlapped with the wirings of the circuit board 10. Accordingly, the occurrence of electrical shorts due to the reflective member 61 may be prevented.

The light emitting module may reduce variations in luminous flux, a color rendering index (CRI), and a correlated color temperature (CCT) of emitted light. In addition, color uniformity may be improved, and differences in color senses may be reduced.

Figure 11:
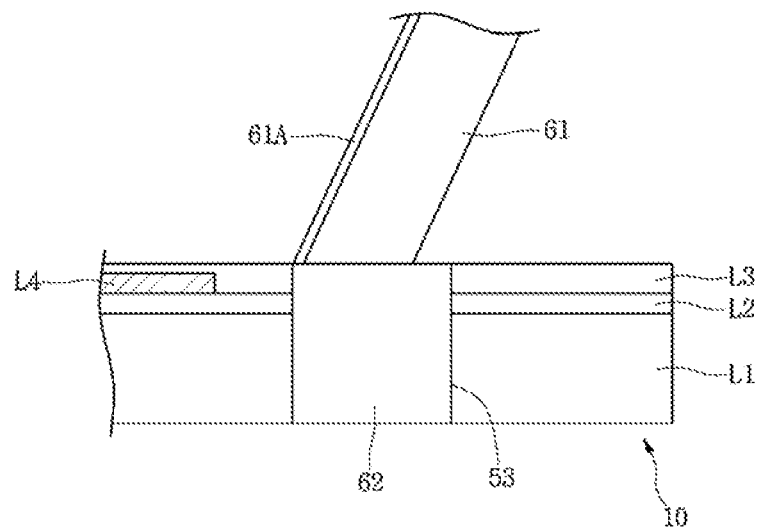
FIG. 11 is a view illustrating another example of a reflective member of the light emitting module of FIG. 8.

FIG. 11 is a view illustrating another example of the reflective member of FIG. 10.

Referring to FIG. 11, a reflective layer 61A may be disposed on the inside surface of the reflective member 61. The reflective layer 61A may contact the upper surface of the circuit board 10, for example, the protective layer L3, and may be disposed so as not to be electrically connected to the wiring parts within the circuit board 10. As another example, the reflective layer 61A may be spaced apart from or may be in a state of non-contact with the upper surface of the circuit board 10, for example, the protective layer L3.

Figure 12:
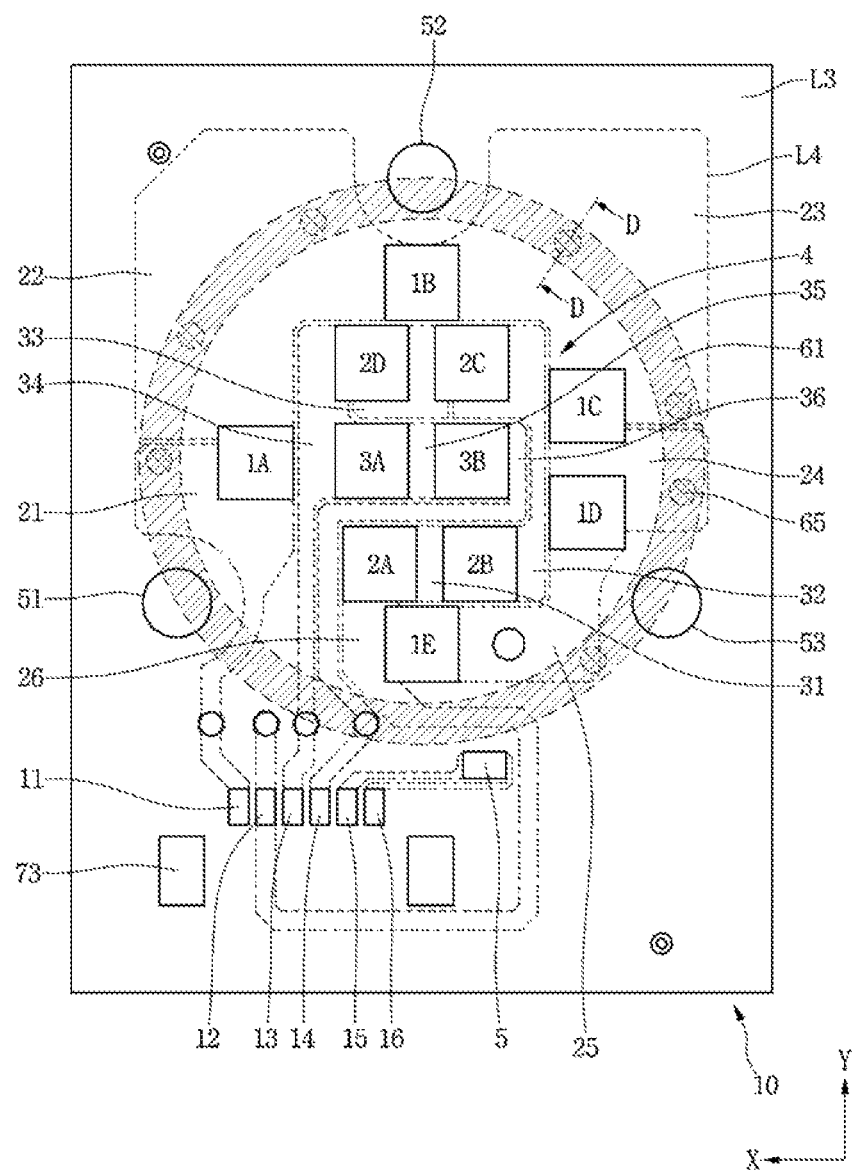
FIG. 12 is a view illustrating a light emitting module according to a third embodiment as another example of the light emitting module of FIG. 9.
Figure 13:
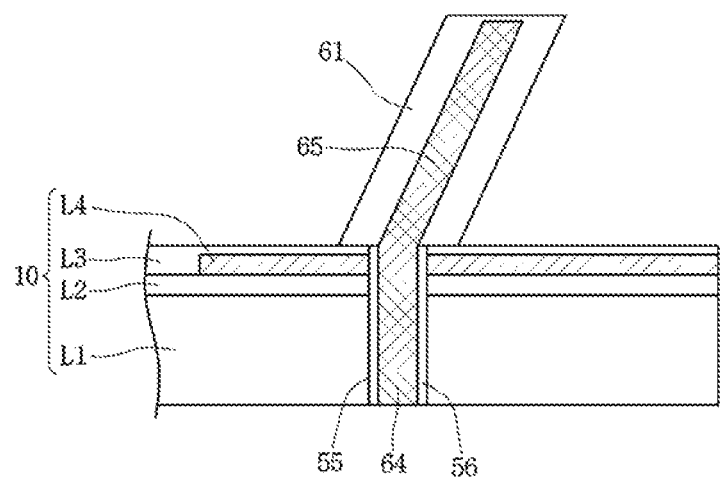
FIG. 13 is a cross-sectional view of the light emitting module of FIG. 12, taken along line D-D.

FIG. 12 is a view illustrating a light emitting module according to a third embodiment as another example of the light emitting module of FIG. 9. FIG. 13 is a cross-sectional view of the light emitting module of FIG. 12, taken along line D-D.

Referring to FIG. 12 and FIG. 13, the light emitting module may include the light source unit 4 having the plurality of first to third light emitting devices 1A,1B,1C, 1D,1E,2A,2B,2C,2D,3A, and 3B disposed on the circuit board 10, the reflective member 61 disposed in the circumference of the light source unit 4, and support protrusions 65 disposed within the reflective member 61.

The reflective member 61 may be coupled to the plurality of openings 51, 52 and 53 disposed in the circuit board 10. The reflective member 61 may contain a plastic material or a resin material such as silicon or epoxy. The reflective member 61 has a ring shape and may be disposed in the circumference of the light source unit 4. The reflective member 61 may have a circular shape or a polygonal shape when viewed from the top thereof.

The reflective member 61 may include a plurality of the support protrusions 65 therein. The plurality of support protrusions 65 may be disposed within the reflective member 61 to be spaced apart from each other.

A height of the support protrusions 65 may be identical to the height of the reflective member 61 and may be exposed outwardly. Through the outward exposure, heat radiation efficiency may be improved.

As another example, the support protrusions 65 may have a height lower than the height of the reflective member 61 and may be embedded in the reflective member 61. The support protrusions 65 are not exposed outwardly through the reflective member 61, whereby the penetration of moisture may be prevented.

The plurality of support protrusions 65 may be disposed on wiring regions of the first wiring part 21,22,23,24,25, and 26. The support protrusions 65 may be disposed to be vertically overlapped with the wirings of the third wiring part 35 and 36 of the circuit board 10. Accordingly, heat conducted from the third wiring part 35 and 36 of the circuit board 10 may be radiated.

A single protrusion 65 or a plurality of support protrusions 65 may be disposed on three or more wirings of the first wiring part 21,22,23,24,25, and 26. For example, two or more protrusions 65 may be disposed on the second and third wirings 22 and 23 of the first wiring part 21,22,23,24, 25, and 26 disposed in the opposite side of connection terminals 11,12,13,14,15, and 16.

The plurality of support protrusions 65 may be formed of a material different from that of the reflective member 61, for example, a metal material. The support protrusions 65 may be formed of an aluminum material, a copper material, or a silver material, but are not limited thereto.

As in FIG. 13, a lower portion 64 of each support protrusion 65 may be penetrated through a via hole 55 of the circuit board 10 and may be exposed to a lower portion of the circuit board 10. The support protrusion 65 may be insulated from the metal layer L1 by an insulating material 56. The support protrusion 65 may not be electrically connected to the wiring layer L4 of the circuit board 10.

Since the plurality of support protrusions 65 are disposed on the first wiring part 21,22,23,24,25, and 26, heat emitted from the first light emitting devices 1A, 1B, 1C, 1D, and 1E connected to the first wiring part 21,22,23,24,25, and 26 may be effectively radiated. That is, the first light emitting devices 1A, 1B, 1C, 1D, and 1E having the highest heat-generation characteristics may be thermally protected.

Figure 14:
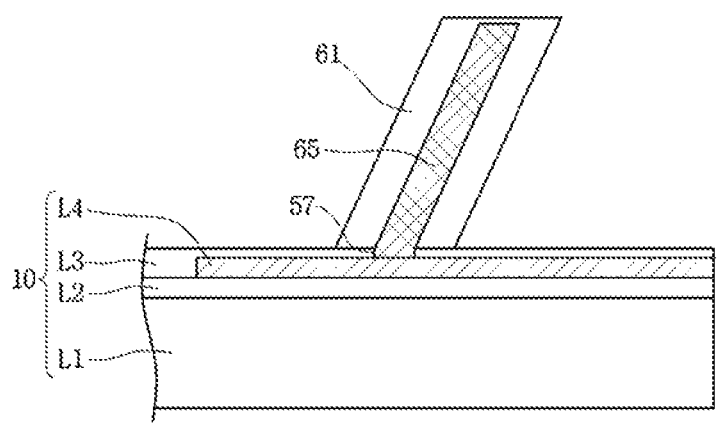
FIG. 14 is another example of a reflective member of the light emitting module of FIG. 13.

FIG. 14 is another example of FIG. 13.

Referring to FIG. 14, the support protrusions 65 within the reflective member 61 may contact the wirings of the first wiring part 21,22,23,24,25, and 26, as in FIG. 12. Accordingly, heat conducted from the wirings of the first wiring part 21,22,23,24,25, and 26 may be radiated through the support protrusions 65. That is, a heat radiation surface area due to the wirings and the support protrusions 65 may be increased.

As another example, the support protrusions 65 within the reflective member 61 may not be in contact with the wirings of the first wiring part 21,22,23,24,25, and 26 and may contact the upper surface of the protective layer L3 of the circuit board 10. The support protrusions 65 may radiate heat conducted from the protective layer L3.

Figure 15:
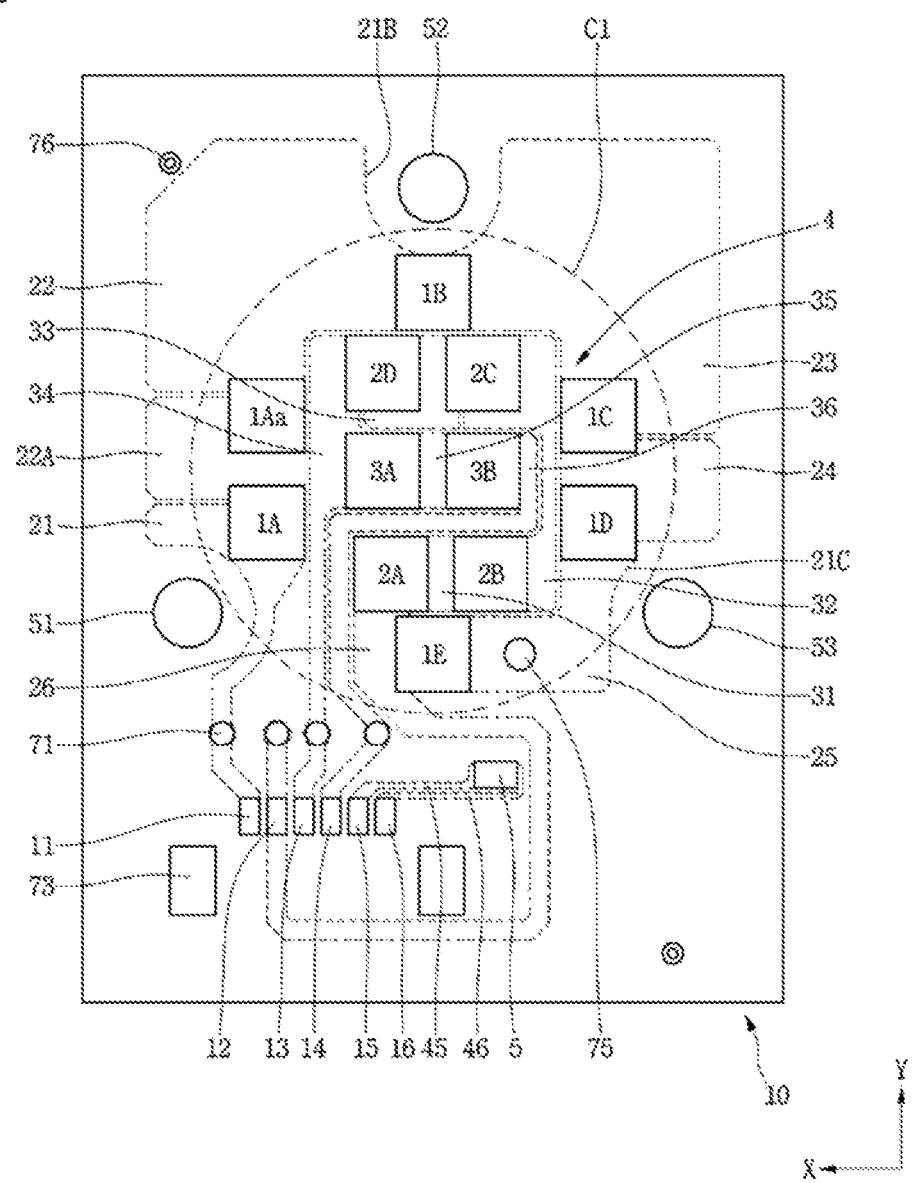
FIG. 15 is a plan view of a light emitting module according to a fourth embodiment.

FIG. 15 is a view of a light emitting module according to a fourth embodiment.

Referring to FIG. 15, the light emitting module may include the light source unit 4 having a plurality of first light emitting devices 1A,1Aa,1B,1C,1D, and 1E and the second and third light emitting devices 2A,2B,2C,2D,3A, and 3B disposed inwardly of the first light emitting devices 1A,1Aa, 1B,1C,1D, and 1E on the circuit board 10. The reflective member 61 according to the second embodiment may be disposed in the circumference of the light source unit 4.

The plurality of first light emitting devices 1A,1Aa,1B, 1C,1D, and 1E may be arranged in series, and may be disposed inwardly of the first virtual circle C1 along the first virtual circle C1.

The plurality of first light emitting devices 1A,1Aa,1B, 1C,1D, and 1E may be disposed such that opposite devices may face each other. For example, at least one pair of devices 1A and 1D, 1Aa and 1C, or 1B and E disposed in opposite sides, that is, in both outsides of the second and third light emitting devices 2A,2B,2C,2D,3A, and 3B, among the first light emitting devices 1A,1Aa,1B,1C,1D, and 1E, may face each other or may correspond to each other. That is, when an even number of the first light emitting devices are provided, pairs of devices may be disposed to face each other. Wirings of a first wiring part 21,22A,22,23,24,35, and 26 may connect the first to sixth devices 1A, 1Aa, 1B, 1C, 1D, and 1E to one another in series.

The plurality of first light emitting devices 1A,1Aa,1B, 1C,1D, and 1E may emit red light and may be disposed outwardly of the second and third light emitting devices 2A,2B,2C,2D,3A, and 3B. The second light emitting devices 2A, 2B, 2C, and 2D may emit green light and may be disposed in both sides of the third light emitting devices 3A and 3B. The third light emitting devices 3A and 3B may emit blue light and may be disposed inwardly of the first light emitting devices 1A,1Aa,1B,1C,1D, and 1E and the second light emitting devices 2A, 2B, 2C, and 2D.

Figure 16:
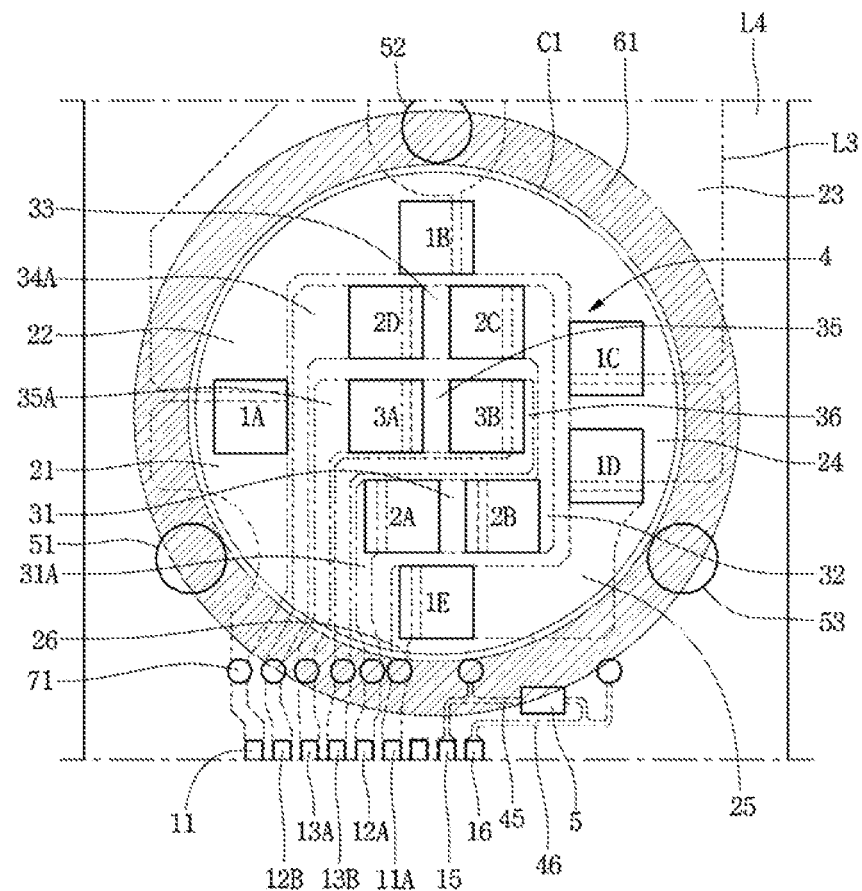
FIG. 16 is another example of the light emitting module of FIG. 15.

FIG. 16 is a view of the light emitting module according to the fourth embodiment. In describing FIG. 16, the same portion as the embodiment disclosed above will be explained with reference to the description of the embodiment disclosed above.

Referring to FIG. 16, the light emitting module may include the circuit board 10 on which the light source unit 4 is disposed, and the reflective member 61 disposed in the circumference of the light source unit 4. The light emitting module may include the light-transmissive member 67 of FIG. 8.

The light source unit 4 may include the plurality of first light emitting devices 1A, 1B, 1C, 1D, and 1E, the plurality of second light emitting devices 2A, 2B, 2C, and 2D, and the plurality of third light emitting devices 3A and 3B.

The plurality of first light emitting devices 1A, 1B, 1C, 1D, and 1E may be connected to one another in series by the first wiring part 21,22,23,24,25, and 26. First and second connection terminals 11 and 11A connected to a connector (not shown) may be disposed in both terminals of the first wiring part 21,22,23,24,25, and 26.

The plurality of second light emitting devices 2A, 2B, 2C, and 2D may be connected to one another in series by a second wiring part 31,32,33, and 34A. Third and fourth connection terminals 12A and 12B connected to the connector may be disposed in both terminals of the second wiring part 31,32,33, and 34A.

The plurality of third light emitting devices 3A and 3B may be connected to each other in series by a third wiring part 35A,35, and 36. Fifth and sixth connection terminals 13A and 13B connected to the connector may be disposed in both terminals of the third wiring part 35A,35, and 36.

Regions in which the wirings 21,22,23,24,25, and 26 of the first wiring part 21 to 26 are disposed may be provided in the outer circumference of the second wiring part 31,32, 33, and 34A. Here, the second wiring part 31,32,33, and 34A may exclude connection lines connected to the third and fourth connection terminals 12A and 12B.

Regions in which the wirings 21,22,23,24,25, and 26 of the first wiring part 21 to 26 are disposed may be provided in the outside of the third wiring part 35A,35, and 36. Here, the third wiring part 35A,35, and 36 may exclude connection lines connected to the fifth and sixth connection terminals 13A and 13B.

An output-side wiring of the first wiring part 21,22,23, 24,25, and 26 may be separated from an input-side wiring of the second wiring part 31,32,33, and 34A, and an output-side wiring of the second wiring part 31,32,33, and 34A may be separated from an input-side wiring of the third wiring part 35A,35, and 36.

The first to sixth connection terminals 11,11A,12A,12B, 13A, and 13B may control the supply of a current to the respective first to third light emitting devices 1A,1B,1C,1D, 1E,2A,2B,2C,2D,3A, and 3B so as to drive the light emitting devices 1A,1B,1C,1D,1E,2A,2B,2C,2D,3A, and 3B according to colors thereof.

The plurality of first light emitting devices 1A, 1B, 1C, 1D, and 1E may be disposed between the outside of the plurality of second and third light emitting devices 2A,2B, 2C,2D,3A, and 3B, and the reflective member 61. The number of the plurality of first light emitting devices 1A, 1B, 1C, 1D, and 1E may be greater than the number of the second light emitting devices 2A, 2B, 2C, and 2D or the number of the third light emitting devices 3A and 3B.

The reflective member 61 may be disposed in the circumference of the plurality of first to third light emitting devices 1A,1B,1C,1D,1E,2A,2B,2C,2D,3A, and 3B, that is, in the circumference of the light source unit 4. The reflective member 61 may contain at least one of plastics or a resin material such as silicon or epoxy. A reflective layer formed of a metal material may be disposed on an inside surface of the reflective member 61. A plurality of support protrusions may be disposed within the reflective member 61, but are not limited thereto.

The reflective member 61 according to the embodiment may be coupled to the openings 51, 52 and 53 of the circuit board 10.

The plurality of support protrusions according to the embodiment may be coupled to the interior of the reflective member 61, but are not limited thereto.

Figure 17:
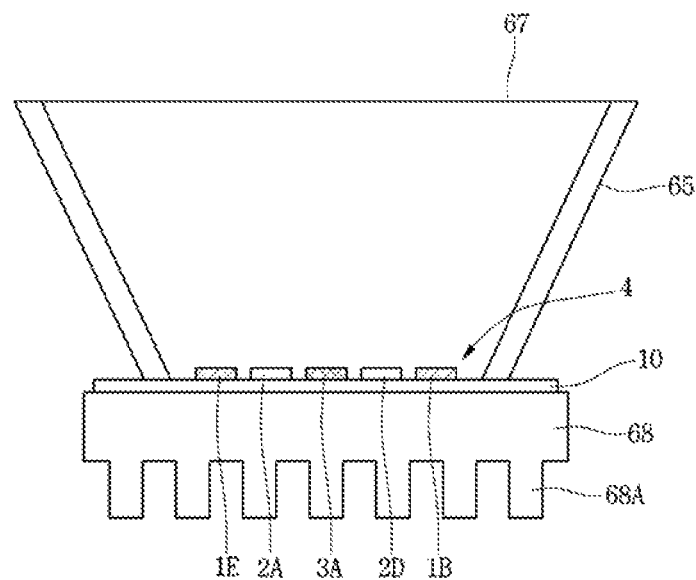
FIG. 17 is a side cross-sectional view of the light emitting module of FIG. 15.

FIG. 17 is a view of a light emitting module according to a fifth embodiment.

Referring to FIG. 17, the light emitting module may include the circuit board 10, the light source unit 4 according to the embodiment, disposed on the circuit board 10, the reflective member 61 disposed on the light source unit 4, the light-transmissive member 67 disposed within the reflective member 61, and a radiator 68 disposed under the circuit board 10. With regard to the circuit board 10, the light source unit 4 and the reflective member 61, please refer to the description disclosed in the aforementioned embodiment (s).

The light-transmissive member 67 may contain a transparent resin material such as silicon or epoxy. A phosphor may not be added in the light-transmissive member 67. As another example, a phosphor such as a yellow or red phosphor may be added in the light-transmissive member 67, but the light-transmissive member 67 is not limited thereto.

The light-transmissive member 67 may contact the upper surface of the circuit board 10 and the inside surface of the reflective member 61. The thickness of the light-transmissive member 67 may be identical to or higher than the height of the reflective member 61, but is not limited thereto. The upper surface of the light-transmissive member 67 may include at least one of a convex surface, a concave surface or a flat surface. The upper diameter of the light-transmissive member 67 may be wider than the lower diameter thereof, but is not limited thereto.

The radiator 68 may have one surface above which the light source unit 4 is disposed. Here, the one surface may be a flat surface or may be a surface having a predetermined curve.

A thickness of the radiator 68 may be thicker than that of the circuit board 10, and may be thinner than that of the light-transmissive member 67.

The radiator 68 may have heat radiation fins 68A. The heat radiation fins 68A may protrude or extend outwardly from one side of the radiator 68. A plurality of the heat radiation fins 68A may protrude in a direction opposite to a surface on which the circuit board 10 is disposed. The heat radiation fins 68A may broaden a heat radiation area of the radiator 68 to improve heat radiation efficiency of the light emitting module. A side-sectional shape of the heat radiation fin 68A may be a cylindrical shape, a polyprismatic shape, or a pillar shape in which a thickness of the heat radiation fin 68A is reduced in an outward direction.

The radiator 68 may be formed of a metal material or a resin material having excellent heat emission efficiency, but is not limited thereto. For example, a material of the radiator 68 may contain at least one of aluminum (Al), nickel (Ni), copper (Cu), silver (Ag), and tin (Sn).

Figure 18:
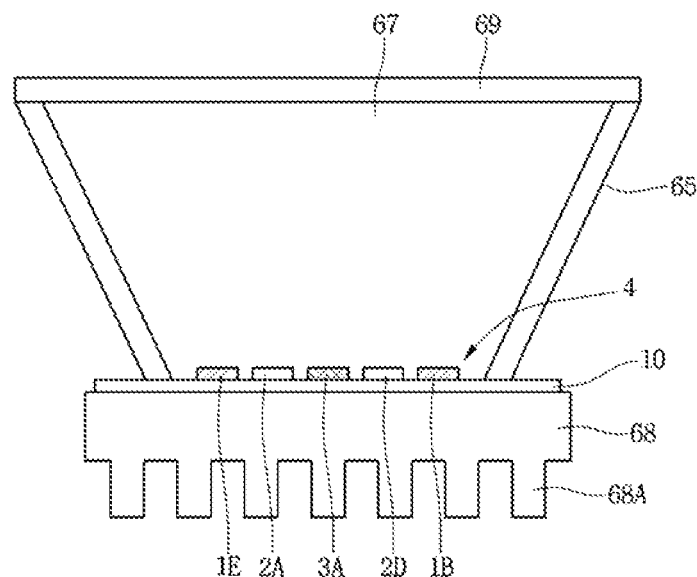
FIG. 18 is a view illustrating a light unit having a light emitting module according to an embodiment.

FIG. 18 is a view illustrating a light unit having a light emitting module according to an embodiment.

Referring to FIG. 18, the light unit may include the circuit board 10, the light source unit 4 according to the embodiment (s), disposed on the circuit board 10, the reflective member 61 disposed in the circumference of the light source unit 4, the light-transmissive member 67 disposed within the reflective member 61, an optical member 69 disposed on the reflective member 61, and the radiator 68 disposed under the circuit board 10. With regard to the circuit board 10, the light source unit 4 and the reflective member 61, please refer to the description disclosed in the aforementioned embodiment (s).

The light-transmissive member 67 disposed within the reflective member 61 may not be formed, but is not limited thereto.

The optical member 69 may include at least one of a diffusion sheet, a horizontal and/or vertical prism sheet, and a brightness enhanced sheet. The diffusion sheet may diffuse incident light, the horizontal and/or vertical prism sheet may collect the incident light into an optional region, and the brightness enhanced sheet may reuse loss light to improve luminance.

The optical member 69 may contact the light-transmissive member 67 when the light-transmissive member 67 is present, but is not limited thereto. The light-transmissive member 67 may support the drooping of the optical member 69.

Although a width or an area of the optical member 69 is described in a structure in which the optical member 69 is disposed on a single light emitting module, the optical member 69 may be disposed on a plurality of light emitting modules when the plurality of light emitting modules are arranged, but is not limited thereto.

In the embodiment, color uniformity of the light emitting module may be improved. In the embodiment, heat radiation efficiency of the light emitting module may be improved by disposing positions of the light emitting devices within the light emitting module according to heat-generation characteristics. In the embodiment, a size of the circuit board may be minimized by disposing positions of the light emitting devices emitting light of different colors based on heat radiation. In the embodiment, reliability of the light emitting module and the lighting device having the same may be improved.

Figure 19:
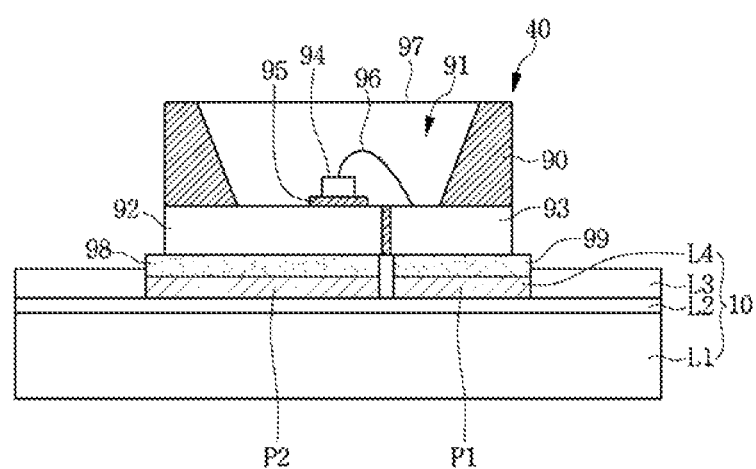
FIG. 19 is a view illustrating one example of a light emitting device of a light emitting module according to an embodiment.

FIG. 19 is a view illustrating an example in which a light emitting device is disposed on a circuit board according to an embodiment.

Referring to FIG. 19, a light emitting module may include the circuit board 10 and a light emitting device 40 on the circuit board 10. The light emitting device 40 may be one of the light emitting devices of the light source unit according to the embodiment, for example, one of the first to third light emitting devices.

The pads P1 and P2 of the circuit board 10 may be electrically connected to the light emitting device 40 by adhesion members 98 and 99.

The circuit board 10 may be a metal core PCB (MCPCB), a resin based PCB, or a flexible PCB (FPCB), but is not limited thereto.

The circuit board 10 may include, for example, the metal layer L1, the insulating layer L2, the wiring layer L4, and the protective layer L3, but is not limited thereto. The wiring layer L4 may include the pads P1 and P2.

The light emitting device 40 may include a body 90, a plurality of electrodes 92 and 93, a light emitting chip 94, a bonding member 95, and a molding member 97.

The body 90 may include one selected from an insulating material, a transmittance material and a conductive material. For example, the body 90 may be formed of at least one of a resin material such as polyphthalamide (PPA), silicon (Si), a metallic material, photo sensitive glass (PSG), sapphire (Al2O3), epoxy molding compound (EMC), polymer group, and a plastic based printed circuit board (PCB). For example, the body 90 may be formed of one selected from a resin material such as polyphthalamide (PPA), and a silicon or epoxy-based material. The body 90 may have a polygonal shape, a circular shape or a shape having a curved surface when viewed from the top, but the embodiment is not limited thereto.

The body 90 may include a cavity 91 which are provided with an opened upper portion and a peripheral portion having inclined surfaces. For example, at least two electrodes 92 and 93 may be disposed on a bottom surface of the cavity 91. The electrodes 92 and 93 may be spaced apart from each other on the bottom surface of the cavity 91. The cavity 91 may have a lower portion having a wider width than that of an upper portion, but the embodiment is not limited thereto.

The electrodes 92 and 93 may include a metallic material, for example, at least one of titanium (Ti), copper (Cu), nickel (Ni), gold (Au), chrome (Cr), tantalum (Ta), platinum (Pt), tin (Sn), silver (Ag), and phosphor (P), and may be configured as a single metal layer or multi-metal layers.

A gap part between the plurality of electrodes 92 and 93 may be formed of an insulating material which is equal to or different from that of the body 90, but the embodiment is not limited thereto.

The light emitting chip 94 may be disposed on at least one of the plurality of electrodes 92 and 93. The light emitting chip 94 may be bonded or flip-bonded to at least one of the electrodes 92 and 93 by using the bonding member 95. The bonding member 95 may include a paste material including silver (Ag).

The plurality of electrodes 92 and 93 may be electrically connected to the pads P1 and P2 of the wiring layer L4 of the circuit board 10 through the adhesion members 98 and 99.

The light emitting chip 94 may selectively emit light in the range between a visible light wavelength and an ultraviolet (UV) wavelength. For example, the light emitting chip 94 may be selected from a red LED chip, a blue LED chip, a green LED chip, a yellow green LED chip, a UV LED chip and a white LED chip. The light emitting chip 94 includes a compound semiconductor of group III-V elements and/or group II-VI elements. Although the light emitting chip 94 is disposed in a chip structure having a lateral type electrode structure in the embodiment, the light emitting chip 94 may disposed in a chip structure having a vertical type electrode structure in which two electrodes are disposed in a vertical direction. The light emitting chip 94 is electrically connected to the plurality of electrodes 92 and 93 through an electrical connection member such as a wire 96.

The light emitting device 40 may be a first light emitting device emitting red light, and in the first light emitting device, the light emitting chip 94 may be formed of a red LED chip or may include a UV LED chip and a red phosphor.

The light emitting device 40 may be a second light emitting device emitting green light, and in the second light emitting device, the light emitting chip 94 may be formed of a green LED chip or may include a UV LED chip and a green phosphor.

The light emitting device 40 may be a third light emitting device emitting blue light, and in the third light emitting device, the light emitting chip 94 may be formed of a blue LED chip or may include a UV LED chip and a blue phosphor. At least one light emitting chip 94 may be disposed in the cavity 91. At least two light emitting chips may be connected to each other in parallel or series, but the embodiment is not limited thereto.

The molding member 97 having a resin material may be formed in the cavity 91. The molding member 97 may include a transparent material such as silicon or epoxy and may be formed in a single layer or a multilayer structure. A top surface of the molding member 97 may include at least one of a flat shape, a concave shape and a convex shape. For example, the top surface of the molding member 97 may be concave or convex and may serve as a light emitting surface of the light emitting chip 94.

The molding member 97 may include phosphor for converting a wavelength of light emitted from the light emitting chip 94 which is included in a resin material such as silicon or epoxy. The phosphor may include one selected from YAG, TAG, silicate, nitride, and oxy-nitride-based materials. The phosphor may include at least one of a red phosphor, a yellow phosphor and a green phosphor, but the embodiment is not limited thereto.

An optical lens (not shown) may be provided on the molding member 97 and may be formed of a transparent material having a refractive index in the range of 1.4 to 1.7. In addition, the optical lens may include a transparent resin material such as poly methacrylic acid methyl (PMMA) having the refractive index of 1.49, polycarbonate having the refractive index of 1.59, and epoxy resin (EP), or a transparent glass.

Figure 20:
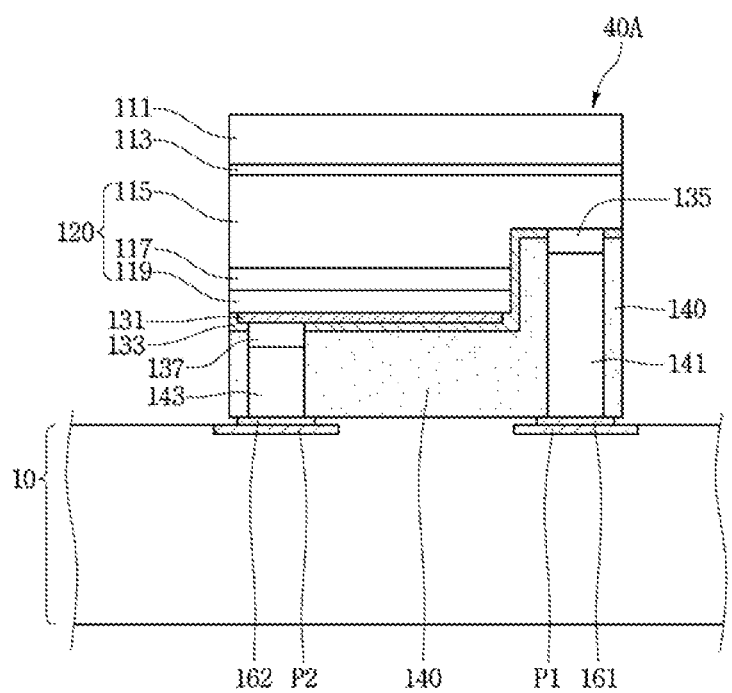
FIG. 20 is a view illustrating a first modified example of a light emitting device of the light emitting module according to the embodiment.

FIG. 20 is a view illustrating a first modified example of a light emitting device of the light emitting module according to the embodiment.

Referring to FIG. 20, the light emitting module may include the circuit board 10 and a light emitting device 40A on the circuit board 10. The light emitting device 40A may be one of the light emitting devices of the light source unit according to the embodiment, for example, one of the first to third light emitting devices.

The pads P1 and P2 of the circuit board 10 may be electrically connected to the light emitting device 40A by adhesion members 161 and 162.

The circuit board 10 may be a metal core PCB (MCPCB), a resin based PCB, or a flexible PCB (FPCB), but is not limited thereto.

The light emitting device 40A may include a substrate 111, a first semiconductor layer 113, a light emitting structure 120, an electrode layer 131, an insulating layer 133, a first electrode 135, a second electrode 137, a first connection electrode 141, a second connection electrode 143, and a support layer 140.

The substrate 111 may use a light transmittable, insulating, or conductive substrate. For example, the substrate 111 may use at least one of sapphire ($Al_2O_3$), SiC, Si, GaAs, GaN, ZnO, GaP, InP, Ge, and $Ga_2O_3$. The substrate 111 may be defined as a growth substrate on which semiconductor layers are stacked. A plurality of convex portions (not shown) may be formed on at least one or all of a top surface and a bottom surface of the substrate 111 to improve light extraction efficiency. A side cross-sectional shape of each convex portion may include at least one of a hemispherical shape, a half-oval shape, or a polygonal shape. Here, the substrate 111 may be removed in the light emitting device 40A, and in this case, the first semiconductor layer 113 or a first conductive semiconductor layer 115 may be disposed as a top layer of the light emitting device 40A.

The first semiconductor layer 113 may be formed below the substrate 111. The first semiconductor layer 113 may be formed using II-V compound semiconductors. The first semiconductor layer 113 may be formed as at least one layer or a plurality of layers using the II-V compound semiconductors. The first semiconductor layer 113 may have the semiconductor layer using III-V compound semiconductors that include at least one of GaN, InN, AlN, InGaN, AlGaN, InAlGaN, AlInN, AlGaAs, GaAs, GaAsP, AlGaInP, and GaP. The first semiconductor layer 113 may have an empirical formula, $In_xAl_yGa_{1-x-y}N$ ($0 \leq x \leq 1$, $0 \leq y \leq 1$, $0 \leq x+y \leq 1$), and may be formed of at least one of a buffer layer and an undoped semiconductor layer. The buffer layer may reduce a difference of lattice constants between the substrate and a nitride semiconductor layer, and the undoped semiconductor layer may improve a crystal quality of a semiconductor. Here, the first semiconductor layer 113 may not be formed.

The light emitting structure 120 may be formed below the first semiconductor layer 113. The light emitting structure 120 may be selectively formed from II-V and III-V compound semiconductors, and emit a predetermined peak wavelength within a wavelength range from an ultraviolet band to a visible ray band.

The light emitting structure 120 includes the first conductive semiconductor layer 115, a second conductive semiconductor layer 119, and an active layer 117 formed between the first conductive semiconductor layer 115 and the second conductive semiconductor layer 119. Another semiconductor layer may be further disposed on at least one of above or below each of the layers 115, 117, and 119, but embodiments are not limited thereto.

The first conductive semiconductor layer 115 may be disposed below the first semiconductor layer 113, and be implemented with a semiconductor to which a first conductive dopant is doped, e.g. an n-type semiconductor layer. The first conductive semiconductor layer 115 includes the empirical formula, $In_xAl_yGa_{1-x-y}N$ (0≤x≤1, 0≤y≤1, 0≤x+y≤1). A material of the first conductive semiconductor layer 115 may be selected from III-V compound semiconductors such as GaN, AlN, AlGaN, InGaN, InN, InAlGaN, AlInN, AlGaAs, GaP, GaAs, GaAsP, and AlGaInP. The first conductive dopant is an n-type dopant which includes dopants such as Si, Ge, Sn, Se, and Te.

The active layer 117 is disposed below the first conductive semiconductor layer 115, selectively includes a single quantum well, a multiple quantum well (MQW), a quantum wire structure, or a quantum dot structure, and includes periods of a well layer and a barrier layer. The periods of the well layer/barrier layer include at least one among pairs of InGaN/GaN, GaN/AlGaN, AlGaN/AlGaN, InGaN/AlGaN, InGaN/InGaN, AlGaAs/GaA, InGaAs/GaAs, InGaP/GaP, AlInGaP/InGaP, and InP/GaAs.

The second conductive semiconductor layer 119 is disposed below the active layer 117. The second conductive semiconductor layer 119 includes, for example, the empirical formula, $In_xAl_yGa_{1-x-y}N$ (0≤x≤1, 0≤y≤1, 0≤x+y≤1). The second conductive semiconductor layer 119 may be formed of at least one compound semiconductor of GaN, InN, AlN, InGaN, AlGaN, InAlGaN, AlInN, AlGaAs, GaP, GaAs, GaAsP, and AlGaInP. The second conductive semiconductor layer 119 is a p-type semiconductor layer, and the first conductive dopant is a p-type dopant, the may include Mg, Zn, Ca, Sr, and Ba.

As another example, in the light emitting structure 120, the first conductive semiconductor layer 115 may be implemented using a p-type semiconductor layer, and the second conductive semiconductor layer 119 may be implemented using an n-type semiconductor layer. A third conductive semiconductor layer having opposite polarity from the second conductive semiconductor layer 119 may be formed on the second conductive semiconductor layer 119. Also, the light emitting structure 120 may be implemented using any one structure among an n-p binding structure, a p-n binding structure, an n-p-n binding structure, and a p-n-p binding structure.

The electrode layer 131 is formed below the second conductive semiconductor layer 119. The electrode layer 131 may include a reflective layer. The electrode layer 131 may include an ohmic contact layer coming in contact with the second conductive semiconductor layer 119 of the light emitting structure 120. A material of the reflective layer may be selected from a material with a reflection rate of 70% or greater, e.g. metals of Al, Ag, Ru, Pd, Rh, Pt, Ir and alloys of two or more of the above metals. The metal of the reflective layer may be in contact below the second conductive semiconductor layer 119. A material of the ohmic contact layer may be selected from a light transmittable material, and a metal or nonmetal material.

The electrode layer 131 may include a stacked structure of a light transmittable electrode layer/reflective layer, and the light transmittable electrode layer may be formed of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), AZO, antimony tin oxide (ATO), GZO, Ag, Ni, Al, Rh, Pd, Ir, Ru, Mg, Zn, Pt, Au, Hf and materials formed of selective combinations of the above. A metallic reflective layer may be disposed below the light transmittable electrode layer, and may be formed of Ag, Ni, Al, Rh, Pd, Ir, Ru, Mg, Zn, Pt, Au, Hf, and materials formed of selective combinations of the above. As another example, the reflective layer may be formed of a distributed Bragg reflection (DBR) structure in which two layers having different refraction rates are alternately disposed.

A light extraction structure such as roughness may be formed at a surface of at least one layer of the second conductive semiconductor layer 119 and the electrode layer 131, and the light extraction structure may change a critical angle of incident light to improve the light extraction efficiency.

The insulating layer 133 may be disposed below the electrode layer 131, and may be disposed at a lower surface of the second conductive semiconductor layer 119, side surfaces of the second conductive semiconductor layer 119 and the active layer 117, and a partial region of the first conductive semiconductor layer 115. The insulating layer 133 is formed at the lower region of the light emitting structure 120 except the electrode layer 131, the first electrode 135, and the second electrode 137 to electrically protect the lower portion of the light emitting structure 120.

The insulating layer 133 includes an insulating material or an insulating resin formed with at least one of an oxide, a nitride, a fluoride, and a sulfide having at least one of Al, Cr, Si, Ti, Zn, and Zr. For example, the insulating layer 133 may be selectively formed of SiO2, Si3N4, Al2O3, or TiO2. The insulating layer 133 may be formed as a single layer or multiple layers, but embodiments are not limited thereto. The insulating layer 133 is formed to prevent an interlayer shortage in the light emitting structure 120 when forming a metallic structure for bonding below the light emitting structure 120.

The insulating layer 133 may be formed of a DBR structure in which a first layer and a second layer having different refraction rates are alternately disposed. The first layer may be formed with any one of $SiO_2$, $Si_3N_4$, $Al_2O_3$, and $TiO_2$, and the second layer may be formed with any one material other than the material of the first layer, but embodiments are not limited thereto. Also, the first layer and the second layer may be formed with the same material or formed of a pair having three or more layers. In this case, the electrode layer may not be formed.

The first electrode 135 may be disposed below the partial region of the first conductive semiconductor layer 115, and the second electrode 137 may be disposed below a portion of the electrode layer 131. The first connection electrode 141 is disposed below the first electrode 135, and the second connection electrode 143 is disposed below the second electrode 137.

The first electrode 135 may be electrically connected to the first conductive semiconductor layer 115 and the first connection electrode 141, and the second electrode 137 may be electrically connected to the second conductive semiconductor layer 119 and the second connection electrode 143.

The first electrode 135 and the second electrode 137 may be formed with at least one of Cr, Ti, Co, Ni, V, Hf, Ag, Al, Ru, Rh, Pt, Pd, Ta, Mo, W or alloys thereof, and may be formed as a single layer or multiple layers. The first electrode 135 and the second electrode 137 may be formed with the same stacked structure or different staked structures. A current spreading pattern such as an arm or finger structure may be further formed on at least one of the first electrode 135 and the second electrode 137. Also, one or a plurality of the first electrodes 135 and the second electrodes 137 may be formed, and the numbers of the first electrodes 135 and the second electrodes 137 are not limited. At least one of the first and second connection electrodes 141 and 143 may be disposed in a plurality, but embodiments are not limited thereto.

The first connection electrode 141 and the second connection electrode 143 provide a lead function of supplying power and a radiation path. Shapes of the first connection electrode 141 and the second connection electrode 143 may include at least one of a circular shape, a polygonal shape, a cylindrical shape, and a polygonal prism shape. The first connection electrode 141 and the second connection electrode 143 may be formed with any one of Ag, Al, Au, Cr, Co, Cu, Fe, Hf, In, Mo, Ni, Si, Sn, Ta, Ti, W, and selective alloys of the above metals. The first connection electrode 141 and the second connection electrode 143 may be plated with any one metal of In, Sn, Ni, Cu, and selective alloys thereof to improve an adhesive force with the first electrode 135 and the second electrode 137.

The support layer 140 may include a thermally conductive material, and be disposed at circumferences of the first electrode 135, the second electrode 137, the first connection electrode 141, and the second connection electrode 143. Lower surfaces of the first and second connection electrodes 141 and 143 may be exposed to a lower surface of the support layer 140.

The support layer 140 is used as a layer for supporting the light emitting device 40A. The support layer 140 is formed of an insulating material, and the insulating material is formed with a resin layer such as silicone resin or epoxy resin. As another example, the insulating material may include a paste or an insulating ink. The insulating material may be formed with a resin including polyacrylate resin, epoxy resin, phenolic resin, polyamides resin, polyimides resin, unsaturated polyesters resin, polyphenylene ether resin (PPE), polyphenilene oxide (PPO) resin, polyphenylenesulfides resin, cyanate ester resin, benzocyclobutene (BCB), polyamido-amine (PAMAM) dendrimers, andpolypropylene-imine (PPI) dendrimers, and PAMAM inner structures and PAMAM-organosilicon (OS) having an organic silicon outer surface solely or in combinations thereof. The support layer 140 may be formed with a different material from the insulating layer 133.

At least one of compounds such as an oxide, a nitride, a fluoride, and a sulfide having at least one of Al, Cr, Si, Ti, Zn, and Zr may be added into the support layer 140. Here, the compound added into the support layer 140 may be a heat diffusing agent, and the heat diffusing agent may be used as powder particles of a predetermined size, a grain, filler, and an additive. The heat diffusing agent includes a ceramic material, and the ceramic material includes at least one of low temperature co-fired ceramic (LTCC), high temperature co-fired ceramic (HTCC), alumina, quartz, calcium zirconate, forsterite, SiC, graphite, fused silica, mullite, cordierite, zirconia, beryllia, and aluminum nitride. The ceramic material may be formed with a metal nitride, which has higher thermal conductivity than a nitride or an oxide, among insulating materials such as the nitride or the oxide, and the metal nitride may include, for example, a material with the thermal conductivity of 140 W/mK or greater. The ceramic material may be ceramic series such as $SiO_2$, $Si_xO_y$, $Si_3N_4$, $SixNy$, $SiOxNy$, $Al_2O_3$, BN, SiC(SiC—BeO), BeO, CeO, and AlN. The thermal conductive material may include a C component (diamond, carbon nanotube (CNT)).

The first and second connection electrodes 141 and 143 of the light emitting device 40A may be mounted on the pads P1 and P2 disposed on the circuit board 10 by the adhesion members 161 and 162. A protective layer (not shown) may be disposed on the upper surface of the circuit board 10. The protective layer may contain a reflective material and for example, may be formed of a resist material such as a white resist material but the embodiment is not limited thereto.

Figure 21:
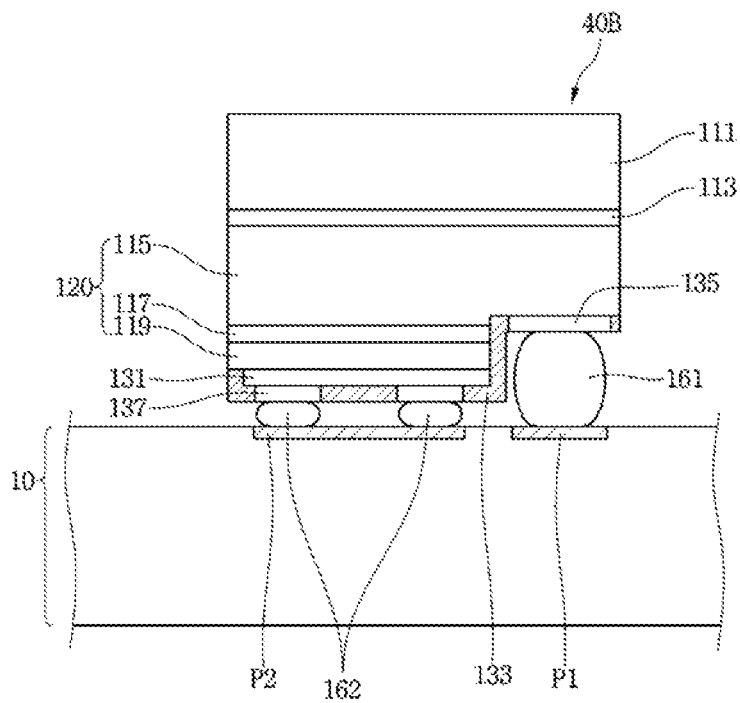
FIG. 21 is a view illustrating a second modified example of a light emitting device of the light emitting module according to the embodiment.

FIG. 21 is a view illustrating a second modified example of a light emitting device of the light emitting module according to the embodiment.

Referring to FIG. 21, the light emitting module may include the circuit board 10 and a light emitting device 40B on the circuit board 10. The light emitting device 40B may be one of the light emitting devices of the light source unit according to the embodiment, for example, one of the first to third light emitting devices.

The light emitting device 40B may include the substrate 111, the first semiconductor layer 113, the light emitting structure 120, the electrode layer 131, the insulating layer 133, the first electrode 135, the second electrode 137, the first connection electrode 141, the second connection electrode 143, and the support layer 140. The substrate 111 and the first semiconductor layer 113 may be removed.

The light emitting device 40B and the circuit board 10 may be connected to each other by the connection electrodes 161 and 162. The pads P1 and P2 of the circuit board 10 may be adhered to the light emitting device 40B by the connection electrodes 161 and 162.

The connection electrodes 161 and 162 may include a conductive pump, that is, a solder pump. A single connection electrode 161 or 162 or a plurality of connection electrodes 161 and 163 may be arranged below the respective electrodes 135 and 137 but the embodiment is not limited thereto. The insulating layer 33 may expose the first and second electrodes 135 and 137, and the connection electrodes 161 and 162 may connect the first and second electrodes 135 and 137, and the pads P1 and P2 of the circuit board 10.

Figure 22:
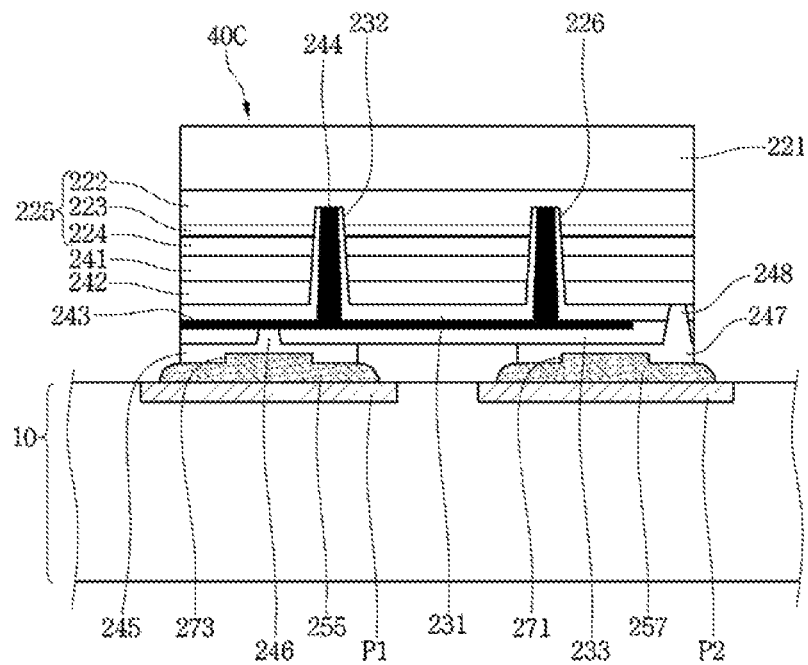
FIG. 22 is a view illustrating a third modified example of a light emitting device of the light emitting module according to the embodiment.

FIG. 22 is a view illustrating a third modified example of a light emitting device of the light emitting module according to the embodiment.

Referring to FIG. 22, the light emitting module may include the circuit board 10 and a light emitting device 40C on the circuit board 10. The light emitting device 40C may be one of the light emitting devices of the light source unit according to the embodiment, for example, one of the first to third light emitting devices.

The circuit board 10 may be a metal core PCB (MCPCB), a resin based PCB, or a flexible PCB (FPCB), but is not limited thereto.

The light emitting device 40C may be connected to the circuit board 10. The light emitting device 40C includes a light emitting structure 225 and a plurality of electrodes 245 and 247. The light emitting structure 225 may be formed with II-VI compound semiconductor layers, e.g. III-V compound semiconductor layers or II-VI compound semiconductor layers. The plurality of electrodes 245 and 247 are selectively connected to the semiconductor layer of the light emitting structure 225 to supply power.

The light emitting structure 225 includes a first conductive semiconductor layer 222, an active layer 223, and a second conductive semiconductor layer 224. The light emitting device 40C may include a substrate 221. The substrate 221 is disposed on the light emitting structure 225. The substrate 221 may be, for example, a light transmittable, insulating substrate, or a conductive substrate.

The electrodes 245 and 247 are disposed on a lower portion of the light emitting device 40C, and the electrodes 245 and 247 include first and second electrodes 245 and 247. The first and second electrodes 245 and 247 are disposed apart from each other below the light emitting device 40C.

The first electrode 245 is electrically connected to the first conductive semiconductor layer 222, and the second electrode 247 is electrically connected to the second conductive semiconductor layer 224. Shapes of bottoms of the first and second electrodes 245 and 247 may be polygonal or circular shapes, or formed to correspond to the shapes of pads P1 and P2 of the circuit board 10. A lower surface area of each of the first and second electrodes 245 and 247 may be formed in sizes corresponding to those of an upper surface of each of first and second electrodes 415 and 417.

The light emitting device 40C may include at least one of a buffer layer (not shown) and an undoped semiconductor layer (not shown) between the substrate 221 and the light emitting structure 225. The buffer layer is a layer for mitigating a difference between lattice constants of the substrate 221 and the semiconductor layer, and may be selectively formed of II-VI compound semiconductors. An undoped III-V compound semiconductor layer may be further formed below the buffer layer, but embodiments are not limited thereto. The substrate 221 may be removed. When the substrate 221 is removed, an upper surface of the first conductive semiconductor layer 222 or an upper surface of another semiconductor layer may be exposed.

The light emitting device 40C includes first and second electrode layers 241 and 242, a third electrode layer 243, and insulating layers 231 and 233. Each of the first and second electrode layers 241 and 242 may be formed as a single layer or multiple layers, and may function as a current spreading layer. The first and second electrode layers 241 and 242 may include a first electrode layer 241 disposed below the light emitting structure 225 and a second electrode layer 242 disposed below the first electrode layer 241. The first electrode layer 241 spreads current and the second electrode layer 242 reflects incident light.

The first and second electrode layers 241 and 242 may be formed of different materials. The first electrode layer 241 may be formed of light transmittable material, e.g. a metal oxide or a metal nitride. The first electrode layer may be selectively formed from ITO, ITO nitride (ITON), IZO, IZO nitride (IZON), IZTO, IAZO, IGZO, IFTO, AZO, ATO, and GZO. The second electrode layer 242 may come in contact with a lower surface of the first electrode layer 241 and function as a reflective electrode layer. The second electrode layer 242 includes, for example, Ag, Au, or Al. When a partial region of the first electrode layer 241 is removed, the second electrode layer 242 may partially come in contact with the lower surface of the light emitting structure 225.

As another example, the first and second electrode layers 241 and 242 may be stacked with an omni-directional reflector (ODR) layer. The ODR structure may be formed with a stacked structure of the first electrode layer 241 having a low refraction rate and the second electrode layer 242 which is a highly reflective metal material coming in contact with the first electrode layer 241. The first and second electrode layers 241 and 242 may be formed with a stacked structure of ITO/Ag. An omni-directional reflection angle may be improved at an interface between the first electrode layer 241 and the second electrode layer 242.

As another example, the second electrode layer 242 may be removed, and may be formed as a reflective layer of another material. The reflective layer may be formed using the DBR structure. The DBR structure includes a structure in which two dielectric layers having different refraction rates are alternately disposed, and may include, for example, any different one among an $SiO_2$ layer, an $Si_3N_4$ layer, a $TiO_2$ layer, an $Al_2O_3$ layer, and an MgO layer. As still another example, the electrode layers 241 and 242 may include both the DBR structure and the ODR structure, and in this case, the light emitting device 40C having a light reflection rate of 98% or greater may be provided. Since light reflected from the second electrode layer 242 is emitted through the substrate 221 in the light emitting device 40C mounted using the flip method, most light may be emitted vertically upward.

The third electrode layer 243 is disposed below the second electrode layer 242, and is electrically insulated with the first and second electrode layers 241 and 242. The third electrode layer 243 includes at least one metal of Ti, Cu, Ni, Au, Cr, Ta, Pt, Sn, Ag, and P. The first electrode 245 and the second electrode 247 are disposed below the third electrode layer 243. The insulating layers 231 and 233 block unnecessary contacts between the first and second electrode layers 241 and 242, the third electrode layer 243, the first and second electrodes 245 and 247, and the light emitting structure 225. The insulating layers 231 and 233 include first and second insulating layers 231 and 233. The first insulating layer 231 is disposed between the third electrode layer 243 and the second electrode layer 242. The second insulating layer 233 is disposed between the third electrode layer 243 and the first electrode 245 or the second electrode 247. The first and second electrodes 245 and 247 may include the same material as the pads P1 and P2.

The third electrode layer 243 is connected to the first conductive semiconductor layer 222. A connection portion 244 of the third electrode layer 243 may protrude as a via structure through the lower portion of the light emitting structure 225, and may come in contact with the first conductive semiconductor layer 222. The connection portion 244 may be disposed in a plural number. A portion 232 of the first insulating layer 231 extends along a circumference of the connection portion 244 to block electrical connections between the third electrode layer 243 and the first and second electrode layers 241 and 242, and the second conductive semiconductor layer 224 and the active layer 223. An insulating layer may be disposed at a side surface of the light emitting structure 225 for side surface protection, but embodiments are not limited thereto.

The second electrode 247 is disposed below the second insulating layer 233, and comes in contact or is connected to at least one of the first and second electrode layers 241 and 242 through an open region of the second insulating layer 233. The first electrode 245 is disposed below the second insulating layer 233 and connected to the third electrode layer 243 through the open region of the second insulating layer 233. Consequently, a protrusion 248 of the first pad 247 is electrically connected to the second conductive semiconductor layer 224 through the first and second electrode layers 241 and 242, and a protrusion 246 of the second pad 248 is electrically connected to the first conductive semiconductor layer 222 through the third electrode layer 243.

The first and second electrodes 245 and 247 are spaced apart from each other at the lower portion of the light emitting device 40C, and face the pads P1 and P2 of the circuit board 10. The first and second electrodes 245 and 247 may include recesses 271 and 273 of polygonal shapes, and the recesses 271 and 273 are convexly formed toward the light emitting structure 225. The recesses 271 and 273 may be formed with depths which are the same or smaller than the thicknesses of the first and second electrodes 245 and 247, and the depths of the recesses 271 and 273 may increase surface areas of the first and second electrodes 245 and 247.

Bonding members 255 and 257 are respectively disposed in a region between the first electrode 245 and the first pad P1 and a region between the second electrode 247 and the second pad P2. The bonding members 255 and 257 may include an electrical conductive material, and have a portion disposed at the recesses 271 and 273. Since the bonding members 255 and 257 are disposed at the recesses 271 and 273, contact areas between the bonding members 255 and 257 and the first and second electrodes 245 and 247 may increase. Consequently, since the first and second electrodes 245 and 247 and the first and second pads P1 and P2 are bonded to each other, electrical reliability and radiation efficiency of the light emitting device 40C may be improved.

The bonding members 255 and 257 may include a solder paste material. The solder paste material includes at least one of Au, Sn, Pb, Cu, Bi, In, and Ag. Since the bonding members 255 and 257 directly conduct heat to the circuit board 10, the thermal conduction efficiency may be improved compared to a structure using a package. Also, since the bonding members 255 and 257 are materials having small differences in thermal expansion coefficients with the first and second electrodes 245 and 247, the thermal conduction efficiency may be improved.

As another example, the bonding members 255 and 257 may include a conductive film, and the conductive film includes one or more conductive particles within an insulating film. The conductive particles may include at least one of a metal, a metal alloy, or carbon, for example. The conductive particles may include at least one of Ni, Ag, Au, Al, Cr, Cu, and C. The conductive film may include an anisotropic conductive film or an anisotropic conductive adhesive agent.

An adhesive member, e.g. a thermally conductive film, may be included between the light emitting device 40C and the circuit board 10. The thermally conductive film may use a polyester resin such as polyethylene terephthalate, polybutylene terephthalate, polyethylene naphthalate, and polybutylene naphthalate, a polyimide resin, an acrylic resin, a styrene-based resin such as polystyrene resin and acrylonitrile-styrene resin, a polycarbonate resin, a polylactic resin, and a polyurethane resin. Also, the thermally conductive film may include at least one of a polyolefin resin such as polyethylene, polypropylene, and ethylene-propylene copolymers, a vinyl resin such as polyvinyl chloride resin and polyvinylidene chloride resin, a polyamide resin, a sulfon-based resin, a polyether-ether ketone based resin, an arylate-based resin, or blends of the above resins.

The light emitting device 40C may emit light through a surface of the circuit board 10 and side surfaces and an upper surface of the light emitting structure 225 to improve the light extraction efficiency. The light emitting device 40C may be directly bonded on the circuit board 10, thereby simplifying the process. Also, as the radiation of the light emitting device 40C is improved, the light emitting device 400 may be usefully used in the lighting field.

Figure 23:
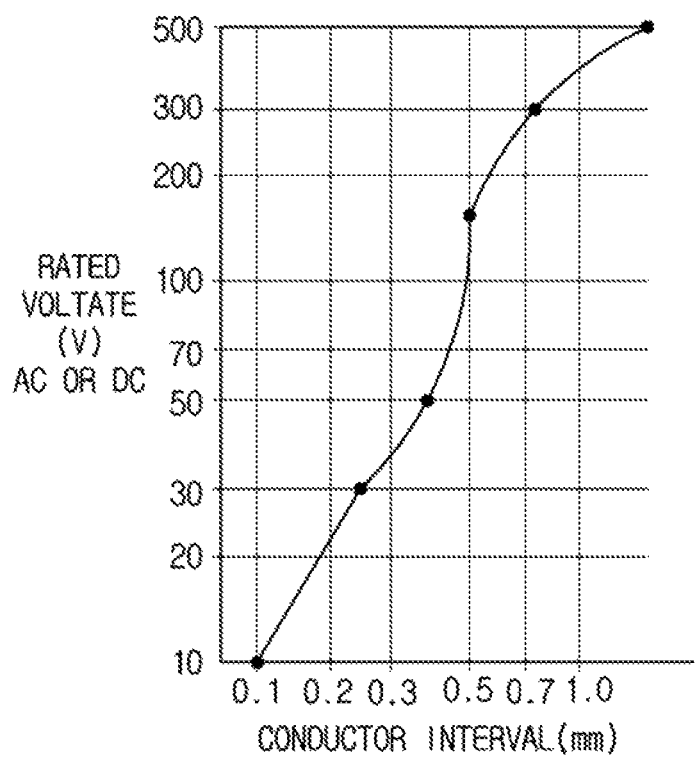
FIG. 23 is a graph illustrating comparison of a voltage depending on a pattern interval of a wiring in a circuit board of the light emitting module according to the embodiment.
Figure 24A:
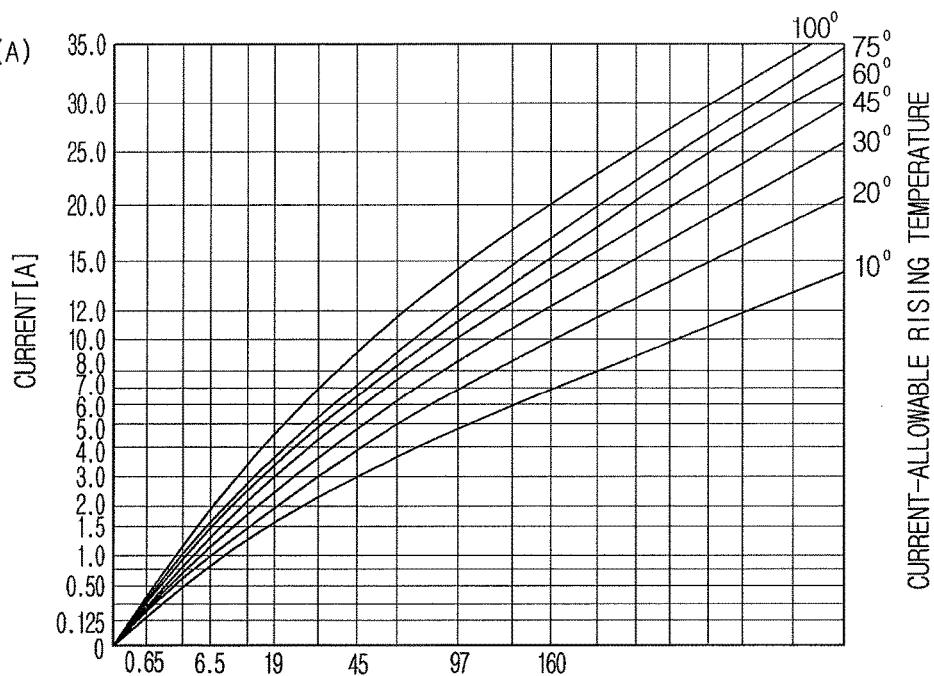
FIG. 24(A) and FIG. 24(B) are views illustrating comparison of the amount of a current depending on a wiring width of a circuit pattern in a circuit board of the light emitting module according to the embodiment.
Figure 24B:
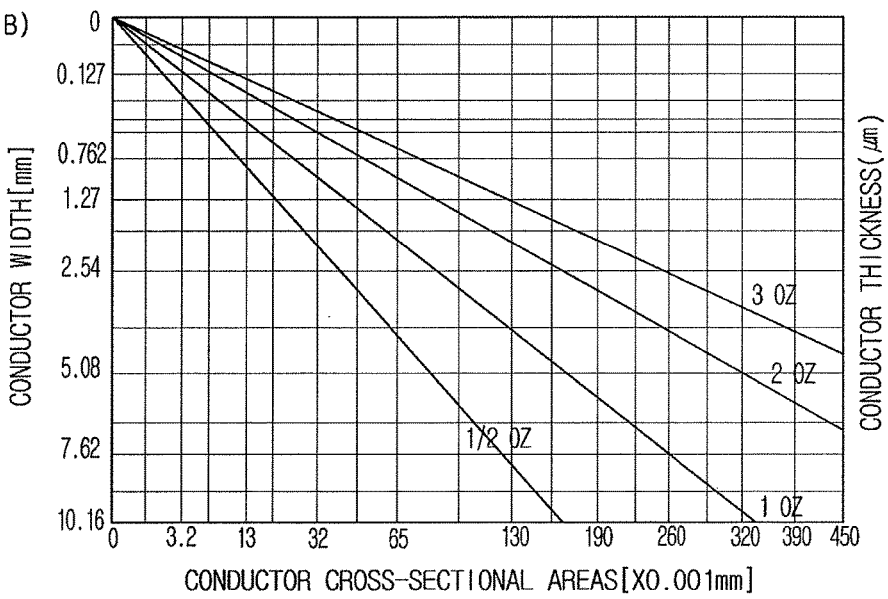

FIG. 23 is a graph illustrating comparison of a voltage depending on a pattern interval of a wiring in a circuit board of the light emitting module according to the embodiment. FIG. 24(A) and FIG. 24(B) are views illustrating comparison of the amount of a current depending on a wiring width of a circuit pattern in a circuit board of the light emitting module according to the embodiment.

Referring to FIG. 23, when a conductor interval increases to 0.3 mm or more, a rated voltage remarkably increases.

FIG. 24(A) is a graph illustrating a current allowable value according to a conductor cross-sectional area of a wiring on a circuit board. FIG. 24(B) is a graph illustrating a relationship between the conductor cross-sectional area and a conductor width. As in FIG. 24(A) and FIG. 24(B), when conductor cross-sectional areas 1/2OZ, 1OZ, 2OZ, and 3OA of wirings disposed on the circuit board are changed, conductor widths increase and thus, current allowable values increase. The pattern 1/2OZ has a thickness of 17.5 μm, the pattern 1OZ has a thickness of 35 μm, the pattern 2OZ has a thickness of 70 μm, and the pattern 3OZ has a thickness of 105 μm. Here, as in FIG. 24(A), a current-allowable rising temperature increases in accordance with increases in conductor cross-sectional area and current.

The light emitting module and/or the light unit having the same according to the embodiments may be applied to lighting devices. The lighting devices may include devices such as indoor lamps, outdoor lamps, streetlamps, automobile lamps, headlamps or tail lamps of moving devices and indicator lamps.

The light emitting module and/or the light unit having the same according to the embodiments may be applied to display devices. The display devices may be provided as modules or units irradiating light in the rears of panels such as liquid crystal display panels.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A light emitting module comprising:
a circuit board; and
a light source unit disposed on the circuit board,
wherein the light source unit includes a plurality of first, second and third light emitting devices emitting light of different colors,
the plurality of first light emitting devices are disposed in an outer circumference of the second and third light emitting devices,
the plurality of second light emitting devices are disposed in both sides of the plurality of the third light emitting devices,
the plurality of first light emitting devices are connected to each other in series and emits light having a wavelength longer than that of light emitted from the second and third light emitting devices,
the plurality of second light emitting devices are connected to each other in series and emits light having a wavelength longer than that of light emitted from the third light emitting devices, the plurality of third light emitting devices are connected to each other in series, and the numbers of the first to third light emitting devices are different from one another.

2. The light emitting module of claim 1, wherein the light emitting module includes a reflective member disposed on the circuit board and disposed in a circumference of the light source unit, the plurality of first light emitting devices are disposed to be more adjacent to the reflective member as compared to the second light emitting devices.

3. The light emitting module of claim 2, wherein the circuit board includes a plurality of openings to which a lower portion of the reflective member is coupled, the plurality of openings being disposed outwardly of a virtual circle passing the plurality of first light emitting devices.

4. The light emitting module of claim 3, wherein the reflective member has a lower diameter of 19 mm to 30 mm and has a diameter greater than that of the virtual circle.

5. The light emitting module of claim 3, wherein the light emitting module includes a light-transmissive member within the reflective member.

6. The light emitting module of claim 2, wherein the light emitting module includes a plurality of support protrusions disposed within the reflective member to be spaced apart from each other and protruding toward the circuit board, the support protrusions containing a metal material.

7. The light emitting module of claim 2, wherein the light emitting module includes a heat sensing device disposed outwardly of the reflective member on the circuit board.

8. The light emitting module of claim 1, wherein the number of the plurality of first light emitting devices is greater than that of the plurality of second light emitting devices, and the number of the plurality of second light emitting devices is greater than that of the plurality of third light emitting devices.

9. The light emitting module of claim 8, wherein the reflective member has an upper diameter wider than a lower diameter, and the reflective member has a height from the circuit board, the height being greater than the lower diameter.

10. The light emitting module of claim 1, wherein the first light emitting devices have heat-generating characteristics higher than those of the second and third light emitting devices.

11. The light emitting module of claim 1, wherein the first light emitting devices emit red light, the second light emitting devices emit green light, and
the third light emitting devices emit blue light.

12. The light emitting module of claim 11, wherein the plurality of second light emitting devices are disposed inwardly of a virtual circle passing the plurality of first light emitting devices centered on a center of the plurality of third light emitting devices, and the plurality of third light emitting devices are disposed inwardly of a virtual circle passing the plurality of second light emitting devices centered on the center of the plurality of third light emitting devices.

13. The light emitting module of claim 11, wherein an output terminal of the plurality of first light emitting devices is connected to an input terminal of the plurality of second light emitting devices, and an output terminal of the plurality of second light emitting devices is connected to an input terminal of the plurality of third light emitting devices.

14. The light emitting module of claim 11, wherein the plurality of first light emitting devices are disposed in such a manner that at least one pair of the first light emitting devices correspond to each other in both outsides of the second and third light emitting devices, and the plurality of second light emitting devices are disposed in such a manner that at least two pairs of the second light emitting devices correspond to each other in both outsides of the third light emitting devices.

15. A light emitting module comprising:

a circuit board; and
a light source unit disposed on the circuit board,
wherein the light source unit includes a plurality of first, second and third light emitting devices emitting light of different colors, the plurality of first light emitting devices are disposed in an outer circumference of the second and third light emitting devices, the plurality of second light emitting devices are disposed in both sides of the plurality of the third light emitting devices, the circuit board includes a first wiring part connecting the plurality of first light emitting devices to each other in series, a second wiring part connecting the plurality of second light emitting devices to each other in series, and a third wiring part connecting the plurality of the third light emitting devices to each other in series, the first wiring part is disposed outwardly of the second and third wiring parts on the circuit board, the first wiring part includes a plurality of wirings, and each of the plurality of wirings has an upper area wider than an upper area of each of wirings of the second and third wiring parts, and the number of each of the first to third light emitting devices increases in accordance with an increase in wavelength of emitted light.

16. The light emitting module of claim 15, wherein the light emitting module includes a reflective member disposed on the circuit board and disposed in a circumference of the light source unit, and the plurality of first light emitting devices are disposed to be more adjacent to the reflective member as compared to the second light emitting devices.

17. The light emitting module of claim 16, wherein the number of the plurality of first light emitting devices is greater than that of the plurality of second light emitting devices, the number of the plurality of second light emitting devices is greater than that of the plurality of third light emitting devices, and the first light emitting devices have heat-generating characteristics higher than those of the second and third light emitting devices.

18. The light emitting module of claim 17, wherein the first light emitting devices emit red light, the second light emitting devices emit green light, and
the third light emitting devices emit blue light.

19. The light emitting module of claim 18, wherein the plurality of second light emitting devices are disposed inwardly of a virtual circle passing the plurality of first light emitting devices centered on a center of the plurality of third light emitting devices, the plurality of third light emitting devices are disposed inwardly of a virtual circle passing the plurality of second light emitting devices centered on the center of the plurality of third light emitting devices, the number of the second light emitting devices is 200% or more of the number of the third light emitting devices, and the number of the first light emitting devices is 125% or more of the third light emitting devices.

20. The light emitting module of claim 18, wherein the light emitting module includes a heat sensing device disposed outwardly of the reflective member, an output terminal of the plurality of first light emitting devices is connected to an input terminal of the plurality of second light emitting devices, and an output terminal of the plurality of second light emitting devices is connected to an input terminal of the plurality of third light emitting devices.

* * * * *